United States Patent
Kawano et al.

(10) Patent No.: US 9,246,098 B2
(45) Date of Patent: Jan. 26, 2016

(54) GE—SB—TE FILM FORMING METHOD, GE—TE FILM FORMING METHOD, AND SB—TE FILM FORMING METHOD

(71) Applicant: Tokyo Electron Limited, Tokyo (JP)

(72) Inventors: Yumiko Kawano, Nirasaki (JP); Susumu Arima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 52 days.

(21) Appl. No.: 14/182,586

(22) Filed: Feb. 18, 2014

(65) Prior Publication Data

US 2014/0162401 A1 Jun. 12, 2014

Related U.S. Application Data

(63) Continuation of application No. PCT/JP2012/070935, filed on Aug. 17, 2012.

(30) Foreign Application Priority Data

Aug. 19, 2011 (JP) ................................. 2011-179981

(51) Int. Cl.
H01L 45/00 (2006.01)
C23C 16/30 (2006.01)
C23C 16/455 (2006.01)

(52) U.S. Cl.
CPC .......... *H01L 45/1616* (2013.01); *C23C 16/305* (2013.01); *C23C 16/45553* (2013.01); *H01L 45/144* (2013.01)

(58) Field of Classification Search
None
See application file for complete search history.

(56) References Cited

U.S. PATENT DOCUMENTS

| | | | | |
|---|---|---|---|---|
| 2008/0017841 A1* | 1/2008 | Lee et al. | ........................... | 257/2 |
| 2009/0142881 A1* | 6/2009 | Xiao et al. | ..................... | 438/102 |
| 2009/0305458 A1* | 12/2009 | Hunks et al. | ................... | 438/102 |
| 2010/0055829 A1* | 3/2010 | Im et al. | ........................ | 438/102 |
| 2010/0267220 A1* | 10/2010 | Quick et al. | ................... | 438/478 |
| 2012/0021590 A1* | 1/2012 | Ishii et al. | ..................... | 438/478 |
| 2012/0028410 A1* | 2/2012 | Marsh | ........................... | 438/102 |

FOREIGN PATENT DOCUMENTS

| | | |
|---|---|---|
| JP | 2009-274949 A | 11/2009 |
| JP | 2010-059546 A | 3/2010 |
| JP | 2011-518951 A | 6/2011 |

OTHER PUBLICATIONS

International Search Report for PCT/JP2012/070935 dated Oct. 16, 2012.

\* cited by examiner

*Primary Examiner* — Stanetta Isaac
(74) *Attorney, Agent, or Firm* — Pearne & Gordon LLP

(57) ABSTRACT

A Ge—Sb—Te film forming method includes a Sb source material introducing process, a first purging process, a Te source material introducing process, a second purging process, a Ge source material introducing process, a third purging process. An additive gas containing at least one of ammonia, methylamine, dimethylamine, hydrazine, monomethylhydrazine, dimethylhydrazine and pyridine is introduced in at least one of the Sb, Te and Ge source material introducing processes and the first to third purging processes.

18 Claims, 10 Drawing Sheets

US 9,246,098 B2

GE—SB—TE FILM FORMING METHOD, GE—TE FILM FORMING METHOD, AND SB—TE FILM FORMING METHOD

CROSS-REFERENCE TO RELATED APPLICATION

This application is a Continuation of International Application No. PCT/JP2012/070935 filed on Aug. 17, 2012, which claims the benefit of Japanese Patent Application No. 2011-179981 filed on Aug. 19, 2011. The entire disclosure of the prior application is incorporated herein by reference in its entirety.

TECHNICAL FIELD

The embodiments described herein pertain generally to a Ge—Sb—Te film forming method, a Ge—Te film forming method, a Sb—Te film forming method and a program.

BACKGROUND ART

Recently, a PRAM (Phase-change Random Access Memory) that stores thereon information by using a phase-change film is attracting attention as a high-speed nonvolatile memory device having a long lifetime.

A phase of a phase-change film is changed between an amorphous phase and a crystalline phase through, for example, a temperature variation. The PRAM stores data by using a difference between resistance values of these two phases. A driving force for the phase change may be obtained by, for example, controlling a pulse amplitude of an electric current.

$Ge_2Sb_2Te_5$, which is a Ge—Sb—Te film, is used as a material for the phase-change film in the PRAM. Conventionally, the Ge—Sb—Te film has been generally formed by PVD such as sputtering. However, since a sufficient step coverage cannot be achieved by PVD, it has been attempted in, for example, Patent Document 1 to form a Ge—Sb—Te film by ALD or CVD which enables obtaining the sufficient step coverage.

Patent Document 1: Japanese Patent Laid-open Publication No. 2009-274949

In Patent Document 1, however, composition controllability as a process is not high, and a composition of the obtained Ge—Sb—Te film is mostly $GeSb_4Te_7$. Further, the Ge—Sb—Te film formed by the method of Patent Document 1 has problems such as low surface smoothness and poor electrical characteristics (for example, a duration in which a high resistance state is maintained is short).

SUMMARY

In view of the foregoing problems, example embodiments provide a film forming method capable of controlling a composition of a Ge—Sb—Te film in a wide range and, also, capable of forming a Ge—Sb—Te film having high surface smoothness and high electrical characteristics.

In one example embodiment, a Ge—Sb—Te film forming method includes a Sb source material introducing process of introducing a Sb source material represented by $(R_2O)_3Sb$; a first purging process of purging with an inert gas after the Sb source material introducing process; a Te source material introducing process of introducing a Te source material represented by $(R_3R_4R_5Si)_2Te$ or $(R_3R_4R_5Si)_2TeR_6$; a second purging process of purging with the inert gas after the Te source material introducing process; a Ge source material introducing process of introducing a Ge source material represented by $(R_1O)_4Ge$ or $(R_1O)_nGeH_{4-n}$; and a third purging process of purging with the inert gas after the Ge source material introducing process. Here, the $R_2$ denotes an aromatic group or an alkyl group that has a straight chain structure, a branched chain structure, or a cyclic structure, and has a carbon number ranging from 1 to 10. Further, each of $R_3$, $R_4$, $R_5$ and $R_6$ denotes a hydrogen, an aromatic group or an alkyl group that has a straight chain structure, a branched chain structure or a cyclic structure, and has a carbon number ranging from 1 to 10, and has a double bond. Moreover, the $R_1$ denotes an aromatic group or an alkyl group that has a straight chain structure, a branched chain structure, or a cyclic structure, and has a carbon number ranging from 1 to 10, and n denotes a natural number ranging from 1 to 3. Furthermore, an additive gas containing at least one of ammonia, methylamine, dimethylamine, hydrazine, monomethylhydrazine, dimethylhydrazine and pyridine is introduced in at least one of the Sb, Te and Ge source material introducing processes and the first to third purging processes.

In accordance with an example embodiment, it is possible to provide a film forming method capable of controlling a composition of a Ge—Sb—Te film in a wide range and, also, capable of forming a Ge—Sb—Te film having high surface smoothness and high electrical characteristics.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

EXPLANATION OF CODES

Figure 1:
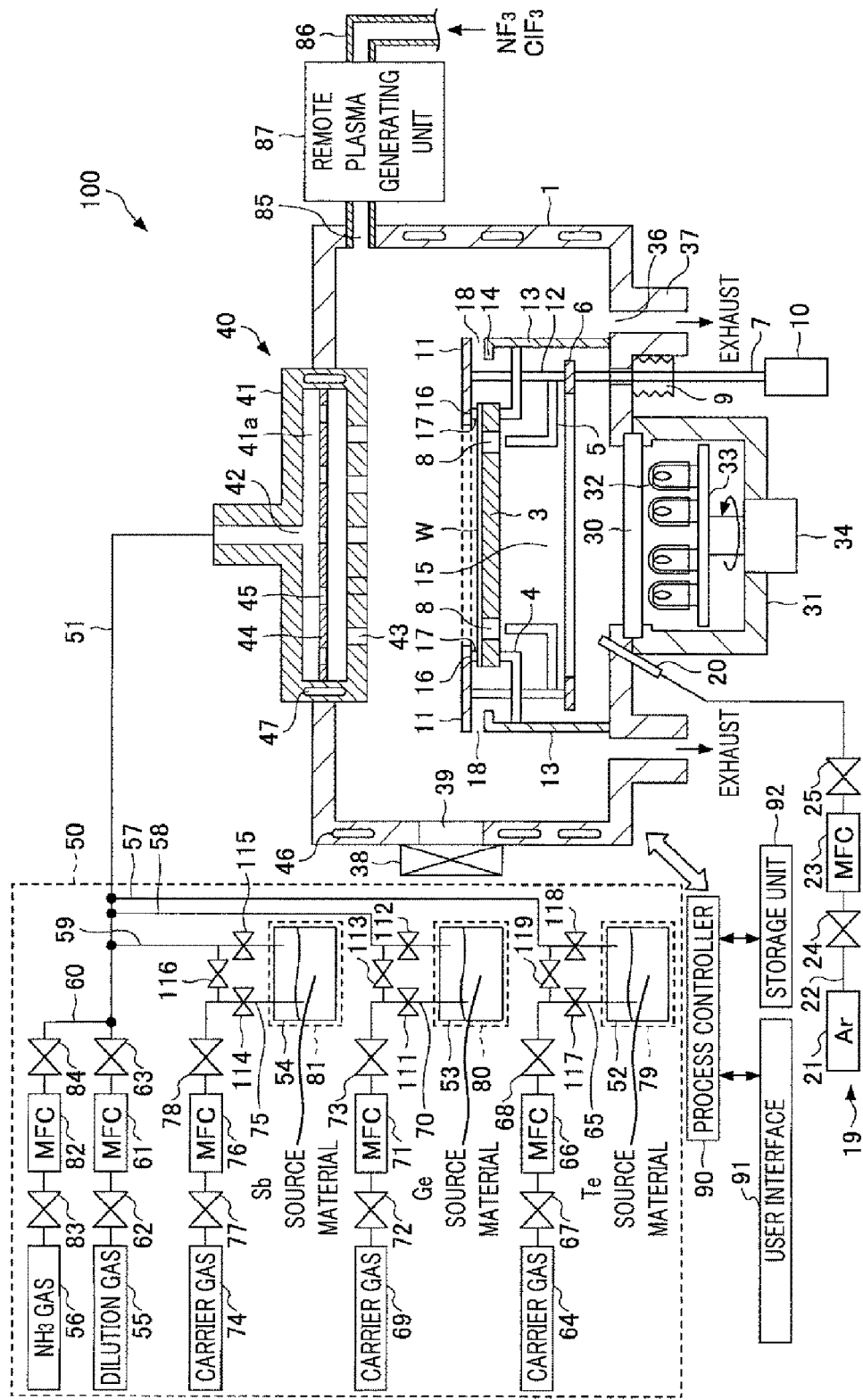
FIG. 1 is a schematic configuration view illustrating an example film forming apparatus capable of performing a Ge—Sb—Te film in accordance with an example embodiment.

1: Processing vessel
3: Mounting table
32: Heating lamp
40: Shower head
50: Processing gas supply device
52: Te source storage
53: Ge source storage
54: Sb source storage
90: Process controller
92: Storage unit
100: Film forming apparatus
W: Semiconductor wafer

DETAILED DESCRIPTION

In the following, example embodiments will be described, and reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

<Precursor and Additive Gas>

First, a Ge source material (also called a precursor), a Sb source material and a Te source material for forming a Ge—Sb—Te film by using ALD (Atomic Layer Deposition) or CVD (Chemical Vapor Deposition) will be described.

As the Ge source material that can be used in the example embodiment, a compound represented by the following general formula (1) or (2) may be used, for example.

$$(R_1O)_4Ge \qquad \text{General Formula (1)}$$

$$(R_1O)_nGeH_{4-n} \qquad \text{General Formula (2)}$$

(In the general formulas (1) and (2), $R_1$ denotes an aromatic group or an alkyl group that has a straight chain structure, a branched chain structure, or a cyclic structure and has a carbon number ranging from 1 to 10, and n denotes a natural number ranging from 1 to 3).

Further, as the Sb source material that can be used in the example embodiment, a compound represented by the following general formula (3) may be used, for example.

$$(R_2O)_3Sb \qquad \text{General Formula (3)}$$

(In the general formula (3), $R_2$ denotes an aromatic group or an alkyl group that has a straight chain structure, a branched chain structure, or a cyclic structure and has a carbon number ranging from 1 to 10).

Furthermore, as the Te source material that can be used in the example embodiment, a compound represented by the following general formula (4) or (5) may be used, for example.

$$(R_3R_4R_5Si)_2Te \qquad \text{General Formula (4)}$$

$$(R_3R_4R_5Si)TeR_6 \qquad \text{General Formula (5)}$$

(In the general formulas (4) and (5), each of $R_3$, $R_4$, $R_5$ and $R_6$ denotes a hydrogen, an aromatic group or an alkyl group that has a straight chain structure, a branched chain structure or a cyclic structure, has a carbon number ranging from 1 to 10, and may have a double bond).

Further, ammonia ($NH_3$), methylamine, dimethylamine, hydrazine, monomethylhydrazine, dimethylhydrazine or pyridine may be used as the additive gas for controlling a composition of a Ge—Sb—Te film, as will be elaborated later. These gases may be used individually or may be used as a mixture gas containing two or more thereof.

<Ge—Sb—Te Film Forming Method>

Now, an example film forming method of a Ge—Sb—Te film in accordance with the example embodiment will be discussed. The Ge—Sb—Te film in accordance with the example embodiment may be formed by ALD or CVD. ALD is used for depositing a thin film while controlling the thin film with high precision and has high step coverage, high film thickness controllability, high film thickness uniformity, and so forth. Thus, using ALD may be desirable. Although a thermal ALD method is used in forming the Ge—Sb—Te film in accordance with the example embodiment, a PEALD (Plasma Enhanced ALD) method may also be used. Typically, although the thermal ALD method has advantages such as a simple apparatus and a low cost, a reaction activity may not be sufficient and a film forming rate may be low depending on the kinds of source materials. Meanwhile, as compared to the thermal ALD method, the PEALD method has a high film forming rate, a low-temperature process, a high density of an obtained film, and so forth.

<Ge—Sb—Te Film Forming Method by ALD>

An example ALD sequence of a Ge—Sb—Te film forming method by ALD in accordance with the example embodiment may include:

(i) a Sb source material introducing process of introducing a Sb source material into a processing vessel, (ii) a first purging process of purging with an inert gas to exhaust a surplus Sb source material and a by-product, (iii) a first Te source material introducing process of introducing a Te source material into the processing vessel, (iv) a second purging process of purging with an inert gas to exhaust a surplus Te source material and a by-product, (v) a Ge source material introducing process of introducing a Ge source material into the processing vessel, (vi) a third purging process of purging with an inert gas to exhaust a surplus Ge source material and a by-product, (vii) a second Te source material introducing process of introducing the Te source material into the process vessel, and (viii) a fourth purging process of purging with an inert gas to exhaust a surplus Te source material and a by-product.

In one example embodiment, by repeating a sequence from (i) to (viii) as a single cycle at least one time, it may be possible to form a Ge—Sb—Te film having a required thickness. In another example embodiment, by repeating a sequence from (i) to (iv) as a single cycle at least one time and by repeating a sequence from (v) to (viii) as a single cycle at least one time, it may be possible to form a Ge—Sb—Te film having a required thickness. In still another example embodiment, by repeating a sequence from (v) to (viii) as a single cycle at least one time and by repeating a sequence from (i) to (iv) as a single cycle at least one time, it may be possible to form a Ge—Sb—Te film having a required thickness. Typically, when the Ge—Sb—Te film is used in a PRAM, the thickness of the Ge—Sb—Te film may be in the range from, e.g., about 20 nm to about 50 nm, desirably, in the range from, e.g., about 20 nm to about 30 nm.

In the processes of introducing the respective source materials, an introduction time during which the source materials are introduced may not be particularly limited, but may be appropriately selected depending on, for example, the kinds of the source materials. By way of example, the introduction time for each source material may be set to be about 2 seconds or about 5 seconds. Further, in the purging processes with the inert gas, an Ar gas, a $N_2$ gas and the like, or a combination thereof may be introduced for, e.g., about 1 second, about 3 seconds, about 5 seconds or about 7 seconds.

Here, by introducing the aforementioned additive gas (e.g., an $NH_3$ gas), it may be possible to control a composition of the Ge—Sb—Te film. The timing for introducing the additive gas may not be particularly limited as long as the additive gas is introduced in at least one of the source material introducing processes of introducing the respective source materials into the processing vessel and the purging processes of purging source gases with the inert gas (i.e., in at least one of the processes (i) to (viii)). By way of non-limiting example, the additive gas may be introduced in the processes (i) and (ii), or in the processes (iii) to (vii). As another example, the additive gas may be introduced in the processes (v) to (viii) or may be introduced in all of the processes (i) to (viii). Even when introducing the additive gas in the processes of purging the source gases with the inert gas, the effect of controlling the composition of the Ge—Sb—Te film may also be achieved. The reason for this is because the additive gas may affect a state of a source material that is adsorbed to a substrate after introduced in a previous source material introducing process, and also affect adsorption of a source material that would be introduced in a following source material introducing process. Accordingly, in the purging process between the introduction of the Sb source material or the Ge source material and the introduction of the Te source material, the additive gas may affect a reaction between the Te source material and the adsorbed Sb source material or a reaction between the Te source material and the adsorbed Ge source material. Thus, an effect of controlling the composition of the Ge—Sb—Te film may be obtained by introducing the additive gas.

Although the operation by which the additive gas controls the composition of the Ge—Sb—Te film is not clearly explained, there is found a tendency that if a supply amount of the additive gas (i.e., a partial pressure of the additive gas) increases, a Ge—Sb—Te film having a low content of Sb (i.e., less Sb) and high contents of Ge and Te (i.e., rich Ge and rich Te) is formed.

The supply amount of the additive gas may not be particularly limited. By way of example, a partial pressure of the additive gas in the system may be set to be in the range from, e.g., about 0.05 Torr to about 3 Torr, and, desirably, set to be equal to or less than about 0.5 Torr. If the supply amount of the additive gas excess about 0.5 Torr in terms of the partial pressure of the additive gas in the system, a void may be formed in an obtained Ge—Sb—Te film after the Ge—Sb—Te film is heat-treated (for example, annealed at a temperature of about 300° C. for about 5 minutes). A flow rate ratio of the additive gas to a dilution gas (or the aforementioned inert gas) may be set to be, e.g., about 0.1, about 0.2, about 0.5 or about 1.0.

Further, besides the effect of controlling the composition of the Ge—Sb—Te film, the additive gas may also improve a deposition rate during a film forming process. Typically, in the above-described Ge—Sb—Te film forming method by ALD, a Ge—Sb—Te film having a smaller thickness (that is, a Ge—Sb—Te film formed through a smaller number of cycles) tends to have a higher concentration of Sb (i.e., rich Sb) and a lower concentration of Te (i.e., less Te) than those of a Ge—Sb—Te film having a larger thickness, even if the two Ge—Sb—Te films are formed through the same sequence. Therefore, it may be possible to obtain a desired composition and a desired thickness of the Ge—Sb—Te film by appropriately selecting the supply amount of the additive gas, the number of cycles of the processes, and so forth.

Moreover, by introducing the aforementioned additive gas, it may be possible to obtain a Ge—Sb—Te film having high smoothness. When manufacturing a PRAM device using a Ge—Sb—Te film, a Ge—Sb—Te film may be buried into, for example, a hole formed in an insulating film. In the film forming method of the example embodiment, since a Ge—Sb—Te film having high smoothness can be formed, it may be possible to bury the Ge—Sb—Te film into, e.g., the hole formed in the insulating film.

In addition, by introducing the aforementioned additive gas, it may be possible to form a Ge—Sb—Te film having a long duration of a high resistance state at a temperature of, e.g., about 125° C. Accordingly, it may be possible to stabilize memory characteristics of the PRAM device.

<Ge—Sb—Te Film Forming Method by CVD>

Now, a Ge—Sb—Te film forming method by CVD in accordance with the present example embodiment will be explained.

Typically, when forming a Ge—Sb—Te film by CVD, the inside of the processing vessel is first purged with an inert gas (e.g., an $N_2$ gas or an Ar gas). Then, the inside of the processing vessel is depressurized by a pump. Afterwards, a Ge source material, a Sb source material and a Te source material, each of which is in the form of a gas, are introduced into the processing vessel at the same time, and a CVD reaction progresses (First film forming process). After the CVD reaction progresses for a preset time period, the inside of the processing vessel is purged with the inert gas (e.g., an $N_2$ gas or an Ar gas).

As stated above, when the Ge—Sb—Te film is used in the PRAM, a thickness of the Ge—Sb—Te film may be in the range from, e.g., about 20 nm to about 50 nm, desirably, in the range from, e.g., about 20 nm to about 30 nm. A CVD reaction time may depend on a pressure within the processing vessel, a temperature within the processing vessel, kinds of the used Ge, Sb and Te Ge source materials, and so forth, and may be appropriately selected to obtain the above-specified film thickness.

Like the above-described case of ALD, by introducing the aforementioned additive gas (e.g., the $NH_3$ gas) for controlling a composition of the Ge—Sb—Te film in the CVD method, it may be also possible to control the composition of the Ge—Sb—Te film. In this case, the additive gas may be introduced when the Ge source material, the Sb source material and the Te source material in the form of gases are introduced into the processing vessel.

<Sb—Te Film Forming Method>

Now, a Sb—Te film forming method in accordance with the present example embodiment will be elaborated. A Sb—Te film may be formed by ALD or CVD. Here, only a method using ALD, which has high step coverage, high film thickness controllability and high film thickness uniformity, will be explained.

An example ALD sequence of the Sb—Te film forming method by ALD in accordance with the present example embodiment may include:

(I) a Sb source material introducing process of introducing a Sb source material into the processing vessel, (II) a first purging process of purging with an inert gas to exhaust a surplus Sb source material and a by-product, (III) a Te source material introducing process of introducing a Te source material into the processing vessel, and (IV) a second purging process of purging with the inert gas to exhaust a surplus Te source material and a by-product.

In the present example embodiment, by repeating a sequence from (I) to (IV) as a single cycle at least one time, it is possible to form a Sb—Te film having a required thickness.

In the present example embodiment, by introducing the aforementioned additive gas (e.g., an $NH_3$ gas), it may be possible to control a composition of the Sb—Te film. Further, by introducing the additive gas, a film forming amount of the Sb—Te film can be increased.

A supply amount of the additive gas may not be particularly limited. By way of example, a partial pressure of the additive gas in the system may be set to be in the range from, e.g., about 0.05 Torr to about 3 Torr, and, desirably, equal to or less than, e.g., about 3 Torr. As the partial pressure of the additive gas in the gas system becomes higher, the film forming amount of the Sb—Te film in a single cycle tends to be increased. If, however, the partial pressure of the additive gas in the system excess about 0.5 Torr, the effect of increasing the film forming amount by the additive gas may be no more improved.

<Ge—Te Film Forming Method>

Now, a Ge—Te film forming method in accordance with the present example embodiment will be elaborated. A Ge—Te film may be formed by ALD or CVD. Here, only a method using ALD, which has high step coverage, high film thickness controllability and high film thickness uniformity, will be explained.

An example ALD sequence of the Ge—Te film forming method by ALD in accordance with the present example embodiment may include:

(1) a Ge source material introducing process of introducing a Ge source material into the processing vessel, (2) a first purging process of purging with an inert gas to exhaust a surplus Ge source material and a by-product, (3) a Te source material introducing process of introducing a Te source material into the processing vessel, and (4) a second purging process of purging with an inert gas to exhaust a surplus Te source material and a by-product.

In the present example embodiment, by repeating a sequence from (1) to (4) as a single cycle at least one time, it is possible to form a Ge—Te film having a required thickness.

In the present example embodiment, by introducing the aforementioned additive gas (e.g., an $NH_3$ gas), it may be possible to control a composition of the Ge—Te film. Further, by introducing the additive gas, a film forming amount of the Ge—Te film can be increased.

A supply amount of the additive gas may not be particularly limited. By way of example, a partial pressure of the additive gas in the system may be set to be in the range from, e.g., about 0.05 Torr to about 3 Torr.

<Film Forming Apparatus>

Now, a vacuum film forming apparatus configured to perform a film forming method of the present example embodiment will be described. Although the description is provided for the case of forming a Ge—Sb—Te film on a semiconductor wafer, the present example embodiment may not be limited thereto. The Ge—Sb—Te film may also be formed on a surface of a substrate material made of, but not limited to, silicon oxide, silicon nitride, titanium nitride, or the like.

FIG. 1 is a schematic configuration view of an example vacuum film forming apparatus configured to perform a Ge—Sb—Te film forming method in accordance with the present example embodiment.

A film forming apparatus 100 includes a processing vessel 1 made of, but not limited to, aluminum and having a cylindrical shape or a box shape. A mounting table 3 configured to mount thereon a semiconductor wafer W as a processing target substrate is provided in the processing vessel 1. The mounting table 3 is made of a carbon material such as a graphite plate or a SiC coated graphite plate, and ceramics such as aluminum nitride that have a thickness of, e.g., about 1 mm and have high thermal conductivity.

A cylindrical partition wall 13, which is made of, but not limited to, aluminum and stands upright from a bottom of the processing vessel 1, is provided around the mounting table 3. An upper end of the partition wall 13 is bent horizontally in, e.g., an L-shape to form a bent portion 14. By providing the cylindrical partition wall 13, an inert gas purge room 15 is formed on a rear surface side of the mounting table 3. A top surface of the bent portion 14 lies on the substantially same plane as a top surface of the mounting table 3 while spaced apart from a periphery of the mounting table 3. Further, a connecting rod 12 is inserted through a gap between the top surface of the bent portion 14 and the periphery of the mounting table 3. The mounting table 3 is supported by one or more, e.g., three (only two are shown in FIG. 1) supporting arms 4 extended from an upper inner wall of the partition wall 13.

Under the mounting table 3, one or more, e.g., three (only two are shown in FIG. 1) L-shaped lifter pins 5 are protruded upward from a ring-shaped supporting member 6. The supporting member 6 is configured to be movable up and down by an elevation rod 7 which penetrates the bottom of the processing vessel 1. The elevation rod 7 is moved up and down by an actuator 10 provided below the processing vessel 1. Through holes 8 are formed in the mounting table 3 to correspond to the lifter pins 5. By moving the lifter pins 5 upward via the elevation rod 7 and the supporting member 6 through the actuator 10, the lifter pins 5 are inserted through the through holes 8 and lifts up the semiconductor wafer W. A portion of the elevation rod 7 that penetrates the processing vessel 1 is covered by a bellows 9. Accordingly, it is possible to suppress an exterior air from entering into the processing vessel 1 through a penetrated portion of the processing vessel 1.

A clamp ring member 11 is provided at a periphery portion of the mounting table 3 and is configured to press the semiconductor wafer W onto the mounting table 3 while supporting a periphery portion of the semiconductor wafer W. The clamp ring member 11 is made of ceramic such as aluminum nitride and has a substantially ring shape conforming to an outline of the semiconductor wafer W. The clamp ring member 11 is connected to the supporting member 6 by the connecting rod 12 and is configured to be moved up and down as one single body with the lifter pins 5. The lifter pins 5 and the connecting rod 12 may be made of ceramic such as alumina.

A multiple number of contact protrusions 16 are formed at a bottom surface of an inner periphery of the clamp ring member 11. The contact protrusions 16 are arranged at a regular distance along a circumferential direction thereof. When the clamp ring member 11 clamps, bottom end surfaces of the contact protrusions 16 come into contact with a top surface of the periphery portion of the semiconductor wafer W and press the top surface, so that a ring-shaped first gap 17 for a gas purge is formed. Typically, each of the contact protrusions 16 may have a diameter of, e.g., about 1 mm and a height of, e.g., about 50 µm. Further, when clamping, an overlapped amount (i.e., a flow path length of the gap 17) between the periphery portion of the semiconductor wafer W and the inner periphery of the clamp ring member 11 may be set to be, e.g., about several millimeters.

An outer periphery portion of the clamp ring member 11 is located above the bent portion 14 of the partition wall 13, and a ring-shaped second gap 18 for a gas purge is formed between the outer periphery portion of the clamp ring member 11 and the bent portion 14. A width (height) of the second gap 18 may be, e.g., about 500 µm, which is approximately 10 times larger than a width of the first gap 17. An overlapped amount (i.e., a flow path length of the second gap 18) between the outer periphery portion of the clamp ring member 11 and the bent portion 14 may be set to be, e.g., about 10 mm. With this configuration, an inert gas in the inert gas purge room 15 can be discharged toward a processing space through the gaps 17 and 18.

An inert gas supply device 19 configured to supply an inert gas into the inert gas purge room 15 is provided at a bottom portion of the processing vessel 1. The inert gas supply device 19 includes a gas nozzle 20 configured to introduce an inert gas such as an Ar gas (backside Ar) into the inert gas purge room 15; an Ar gas supply source 21 configured to supply the Ar gas as the inert gas; and a line 22 configured to guide the Ar gas to the gas nozzle 20 from the Ar gas supply source 21. Further, the line 22 is equipped with a mass flow controller 23 as a flow rate controller and opening/closing valves 24 and 25. The inert gas may not be limited to the Ar gas, and other rare gas such as a He gas may be used instead.

A transmission window 30 made of a heat ray transmitting material such as quartz is hermetically provided at a bottom position of the processing vessel 1 directly under the mounting table 3. Below the transmission window 30, a box-shaped heating room 31 is provided to surround the transmission window 30. Within the heating room 31, a multiple number of heating lamps 32 as a heating device are mounted on a rotatable table 33 which also serves as a reflection mirror. The rotatable table 33 is rotated about a rotation shaft by a rotating motor 34 which is provided at a bottom portion of the heating room 31. Heat rays emitted from the heating lamps 32 are irradiated onto a bottom surface (rear surface) of the mounting table 3 after transmitted through the transmission window 30 and heats the mounting table 3.

An exhaust opening 36 is formed at a periphery portion of the bottom of the processing vessel 1, and an exhaust line 37 connected to a non-illustrated vacuum pump is connected to the exhaust opening 36. By exhausting a gas from the processing vessel 1 through the exhaust opening 36 and the exhaust line 37, the inside of the processing vessel 1 can be maintained at a preset vacuum level. Further, provided at a side wall of the processing vessel 1 are a loading/unloading opening 39 through which the semiconductor wafer W is loaded and/or unloaded; and a gate valve 38 configured to open and/or close the loading/unloading opening 39.

A shower head 40 configured to introduce a source gas or the like into the processing vessel 1 is provided at a ceiling portion of the processing vessel 1 facing the mounting table 3. The shower head 40 is made of, but not limited to, aluminum. The shower head 40 has a disk-shaped head main body 41 having an internal space 41*a*. A gas inlet opening 42 is formed at a ceiling portion of the head main body 41, and a processing gas supply device 50 configured to supply a processing gas required for forming a Ge—Sb—Te film is connected to the gas inlet opening 42 via a line 51.

A multiple number of gas discharging holes 43 are formed in an entire surface of a bottom of the head main body 41. The gas supplied into the head main body 41 is discharged into a processing space within the processing vessel 1 through the gas discharging holes 43 to be discharged on the entire surface of the semiconductor wafer W. Further, a diffusion plate 44 having a multiple number of gas diffusion holes 45 is provided in a space 41*a* within the head main body 41. Accordingly, it is possible to supply the gas onto the surface of the semiconductor wafer W more uniformly. Furthermore, cartridge heaters 46 and 47 for temperature control are provided within the sidewall of the processing vessel 1 and in a sidewall of the shower head 40. By providing the cartridge heaters 46 and 47, it is possible to maintain the sidewall of the processing vessel and portions of the shower head that are in contact with the source gas at a preset temperature.

The processing gas supply device 50 includes a Te source storage 52 that stores therein a Te source material; a Ge source storage 53 that stores therein a Ge source material; and a Sb source storage 54 that stores therein a Sb source material. The processing gas supply device 50 also includes a dilution gas supplying source 55 configured to supply a dilution gas such as an argon gas for diluting a gas within the processing vessel 1; and a composition control gas supplying source 56 configured to supply a gas (e.g., a $NH_3$ gas) for controlling a composition of the Ge—Sb—Te film to be described later in detail. FIG. 1 illustrates a configuration example where a same gas kind (e.g., an Ar gas) is used as both the inert gas and the dilution gas, and the dilution gas supplying source 55 also serves as an inert gas supply source. However, the present example embodiment may not be limited thereto, and an additional inert gas supplying source may be provided.

A line 57 extended from the Te source storage 52, a line 58 extended from the Ge source storage 53, a line 59 extended from the Sb source storage 54, and a line 60 extended from the composition control gas supplying source 56 and the dilution gas supplying source 55 are provided at the line 51 which is connected to the shower head 40. The dilution gas supplying source 55 is equipped with a mass flow controller (MFC) 61 as a flow rate controller and opening/closing valves 62 and 63 provided upstream and downstream of the mass flow controller 61, respectively. The control gas supplying source 56 is equipped with a mass flow controller (MFC) 82 as a flow rate controller and opening/closing valves 83 and 84 provided upstream and downstream of the mass flow controller 82.

A carrier gas supplying source 64 configured to supply a carrier gas for bubbling of Ar or the like is connected to the Te source storage 52 via a line 65. The line 65 is equipped with a mass flow controller (MFC) 66 as a flow rate controller and opening/closing valves 67 and 68 provided upstream and downstream of the mass flow controller 66. A carrier gas supplying source 69 configured to supply a carrier gas such as Ar is connected to the Ge source storage 53 via a line 70. The line 70 is equipped with a mass flow controller (MFC) 71 as a flow rate controller and opening/closing valves 72 and 73 provided upstream and downstream of the mass flow controller 71. Further, a carrier gas supplying source 74 configured to supply a carrier gas such as Ar is connected to the Sb source storage 54 via a line 75. The line 75 is equipped with a mass flow controller (MFC) 76 as a flow rate controller and opening/closing valves 77 and 78 provided upstream and downstream of the mass flow controller 76.

Heaters 79, 80 and 81 are provided at the Te source storage 52, the Ge source storage 53 and the Sb source storage 54, respectively. The Te source material, the Ge source material and the Sb source material stored in the respective source storages are heated by the heaters 79, 80 and 81, respectively and are supplied into the processing vessel 1 by, for example the bubbling. Non-illustrated heaters may be also provided at the line connected to the processing vessel 1 to supply the vaporized Te source material, the vaporized Ge source material and the vaporized Sb source material, or may be also provided at the mass flow controllers therefor.

Although the Te source material and the Sb source material may be supplied in the bubbling manner, it may be also possible to supply them in the mass flow controller manner. Further, it may be also possible to supply a source material in a liquid state to a vaporizer while controlling the flow rate thereof by a liquid mass flow controller, and then, vaporize the source material and supply the vaporized source material. Further, in the above description, although each source gas, the dilution gas and the composition control gas are introduced into the shower head 40 through the single line 51, the example embodiment may not be limited thereto. By way of example, the gases may be classified into two groups: one group including the Ge source material and the Sb source material and the other group including the Te source material, the dilution gas and the composition control gas. The two groups of gases may be introduced into the shower head 40 through two separated lines. Further, these groups of gases may not be mixed in the shower head 40 but may be mixed in the processing vessel 1.

As illustrated in FIG. 1, the line 75 and the line 59 are connected with each other via an opening/closing valve 116. Further, an opening/closing valve 114 is provided at the line 75 to be located between the opening closing valve 116 and the Sb source storage 54. An opening/closing valve 115 is provided at the line 59 to be located between the opening/closing valve 116 and the Sb source storage 54. When supplying the Sb source material by the bubbling method, the opening/closing valve 116 is closed, while the opening/closing valve 114 and the opening/closing valve 115 are opened. When forming a Ge—Sb—Te film by ALD, a carrier Ar gas is flown as a counter purge between the respective processes of introducing the source materials in order to suppress each source material from entering into the source storages of the other source materials. To elaborate, when introducing the Ge source material (or Te source material), the carrier Ar gas is flown from the carrier gas supplying source 74 in order to suppress the Ge source material (or Te source material) from being flown into the Sb source storage. In this case, the opening/closing valve 116 is opened, while the opening/closing valve 114 and the opening/closing valve 115 are closed. That is, the counter purge means supplying the carrier gas into the chamber by bypassing the bottles (source storages). Further, opening/closing valves 111 to 113 and opening/closing valves 117 to 119, which have the same configuration as those of the opening/closing valves 114 to 116, are provided at the line 70 and the line 58 connected to the Ge source storage and the line 65 and the line 57 connected to the Te source storage, respectively.

A cleaning gas inlet 85 through which a cleaning gas is introduced is formed at an upper sidewall portion of the processing vessel 1. A line 86 for supplying the cleaning gas is connected to the cleaning gas inlet 85, and a remote plasma generating unit 87 is provided at the line 86. The cleaning gas supplied through the line 86 is excited into plasma within the remote plasma generating unit 87, and then, is supplied into the processing vessel 1, so that the inside of the processing vessel 1 is cleaned. Alternatively, the remote plasma generating unit 87 may be provided directly above the shower head 40, and the cleaning gas may be supplied through the shower head 40. The cleaning gas may be, but not limited to, a $NF_3$ gas, a $ClF_3$ gas or a $F_2$ gas. When the $ClF_3$ gas is used as the cleaning gas, a plasma-less thermal cleaning may be performed without using the remote plasma.

The film forming apparatus 100 further includes a process controller 90 having a microprocessor (computer). Each constituent component of the film forming apparatus 100 is controlled by the process controller 90. A user interface 91 including, e.g., a display unit configured to visually display operational statuses of each constituent component of the film forming apparatus 100 is connected to the process controller 90. Also connected to the processing controller 90 is a storage unit 92 that stores a control program for implementing various processes in the film forming apparatus 100, a control program (i.e., processing recipes) for performing a preset process in each constituent component of the film forming apparatus 100 according to processing conditions, various kinds of database, and so forth. The processing recipes are stored in a non-illustrated program within the storage unit 92. The program may be stored on a fixed device such as a hard disk or may be stored on a portable device such as a CD-ROM, a DVD, a flash memory, or the like. Further, the recipes may be appropriately transmitted from another apparatus through, e.g., a dedicated line.

A necessary processing recipe may be retrieved from the storage unit 92 in response to an instruction from the user interface 91 and performed under the control of the process controller 90, so that a required process is performed in the film forming apparatus 100.

In the present example embodiment, the vacuum film forming apparatus 100 is described to be capable of performing the Ge—Sb—Te film forming method. However, the present apparatus may also be applicable to a vacuum film forming apparatus configured to form a Sb—Te film or a vacuum film forming apparatus configured to form a Ge—Te film.

<First Example Embodiment>

Now, an example embodiment in which a formation of a Ge—Sb—Te film by ALD can be verified will be explained.

In the present example embodiment, a temperature of the sidewall of the processing vessel (chamber) 1 is set to be, e.g., about 50° C. to about 60° C. by the cartridge heaters 46. Further, a temperature of the mounting table is set to be, e.g., about 70° C. by adjusting a lamp power in advance, and a wafer W having a diameter of, e.g., about 300 mm is loaded into the processing vessel by using an arm of a transfer robot. Then, a Ge—Sb—Te film is formed in the above-described sequences under the following conditions (see Table 1).

Furthermore, $Ge(OCH_3)_4$ is used as a Ge source material; $Sb(OC_2H_5)_3$ is used as a Sb source material; and $Te(Si(CH_3)_3)_2$ is used as a Te source material. Each of these source materials is supplied from the source storage (bottle) heated to a temperature ranging from, e.g., about 30° C. to about 50° C. through a bubbling method by flowing an Ar gas (carrier gas) at a preset flow rate. At this time, the lines from an outlet side of the source storage to the processing vessel are maintained at, e.g., about 50° C. to about 60° C. by a mantle heater.

Further, when performing a film forming method by ALD, besides the source gases and the carrier Ar gas, a dilution Ar gas for diluting a gas within the chamber and a backside Ar gas for suppressing the source gases from being introduced to a rear surface of the substrate are also supplied.

Further, between the respective processes of introducing the source materials, a carrier Ar gas is flown as the counter purge in order to suppress each source material from entering into the source storages of the other source materials. Further, the carrier Ar gas is also flown as the counter purge in a purging process with an inert gas.

Film Forming Conditions:
(Supply of Additive Gas)
Additive gas (NH$_3$) adding process: see Table 1
Flow rate ratio of the additive gas (NH$_3$) to the dilution gas (or to the inert gas in the purging process): see Table 1
(Common Conditions for Each Process)
Chamber pressure: about 800 Pa (about 6 Torr)
Counter purge flow rate (Te): about 500 mL/min (sccm)
Counter purge flow rate (Sb): about 100 mL/min (sccm)
Counter purge flow rate (Ge): about 100 mL/min (sccm)
Backside Ar gas flow rate: about 200 mL/min (sccm)
Flow rate of the dilution gas (or inert gas in the purging process): see Table 1 (for example, about 100 mL/min (sccm))

Here, the counter purge flow rates (Te), (Sb) and (Ge) refer to flow rates of the carrier Ar gas which is flown to bypass the Te, Sb, Ge source storages in order to suppress the Te, Sb, Ge source materials from being introduced into the Te, Sb, Ge lines when the Te, Sb, Ge source materials are not flown.

(i) A Sb source material introducing process of introducing the Sb source material into the processing vessel
Carrier gas flow rate for the Sb source material: about 100 mL/min (sccm)
Sb source material supply time: about 2 seconds
(ii) A first purging process of purging with an inert gas to exhaust a surplus Sb source material and a by-product
Inert gas (Ar gas) flow rate: about 100 mL/min (sccm)
Inert gas supply time: about 5 seconds
(iii) A first Te source material introducing process of introducing the Te source material into the processing vessel
Carrier gas flow rate for Te source material: about 100 mL/min (sccm)
Te source material supply time: about 2 seconds
(iv) A second purging process of purging with the inert gas to exhaust a surplus Te source material and a by-product
Inert gas (Ar gas) flow rate: about 100 mL/min (sccm)
Inert gas supply time: about 1 second
(v) A Ge source material introducing process of introducing the Ge source material into the processing vessel
Carrier gas flow rate for Ge source material: about 100 mL/min (sccm)
Ge source material supply time: about 5 seconds
(vi) A third purging process of purging with the inert gas to exhaust a surplus Ge source material and a by-product
Inert gas (Ar gas) flow rate: about 100 mL/min (sccm)
Inert gas supply time: about 1 second
(vii) A second Te source material introducing process of introducing the Te source material into the processing vessel
Carrier gas flow rate for Te source material: about 100 mL/min (sccm)
Te source material supply time: about 2 seconds
(viii) A fourth purging process of purging with the inert gas to exhaust a surplus Te source material and a by-product
Inert gas (Ar gas) flow rate: about 100 mL/min (sccm)
Inert gas supply time: about 1 second
Number of cycles: 5 times to 35 times (see Table 1)

TABLE 1

|  | NH$_3$ adding process | Ratio of NH$_3$(sccm)/dilution gas (or inert gas in purging process) (Ar)(sccm) | Composition (atom %) Ge | Sb | Te | Number of cycles | Film thickness (nm) | NH$_3$ partial pressure (Torr) |
|---|---|---|---|---|---|---|---|---|
| Experimental example 1 | (iii)~(viii) | 50/100 | 28 | 14 | 58 | 20 | 38 | 0.35 |
| Experimental example 2 | (iii)~(viii) | 100/100 | 30 | 7 | 63 | 20 | 62 | 0.67 |
| Experimental example 3 | (iii)~(viii) | 100/200 | 31 | 7 | 62 | 25 | 84 | 0.60 |
| Experimental example 4 | (iii)~(viii) | 100/500 | 25 | 19 | 56 | 20 | 24 | 0.46 |
| Experimental example 5 | (iii)~(viii) | 50/500 | 22 | 22 | 56 | 25 | 28 | 0.24 |
| Experimental example 6 | ALL | 50/500 | 22 | 23 | 55 | 20 | 26 | 0.24 |
| Experimental example 7 | (i), (ii) | 100/500 | 24 | 22 | 54 | 20 | 25 | 0.46 |
| Experimental example 8 | (iii)~(viii) | 300/100 | 32 | 10 | 58 | 12 | 43 | 1.64 |
| Experimental example 9 | (iii)~(viii) | 500/100 | 31 | 20 | 50 | 5 | 15 | 2.31 |
| Experimental example 10 | (iii)~(viii) | 100/100 | 19 | 28 | 53 | 5 | 18 | 0.67 |
| Comparative example 1 | — | — | 18 | 27 | 56 | 35 | 30 | 0 |

Further, a comparative example in which an additive gas (NH$_3$) is not supplied is also shown in Table 1.

Thicknesses and compositions of formed thin films are obtained by X-ray fluorescent analysis (XRF) corrected by Rutherford backscattering spectrometry (RBS).

As can be seen from Table 1, by introducing the NH$_3$ gas as the additive gas, it is possible to control a composition of the Ge—Sb—Te film in a wide range. To be more specific, as compared to a Ge—Sb—Te film obtained by the conventional method, it is possible to form a Ge—Sb—Te film containing rich Ge, less Sb and rich Te.

<Second Example Embodiment>

Except that conditions for forming a Ge—Sb—Te film are changed as follows, a Ge—Sb—Te film is formed through the same processes as those of the first example embodiment (see Table 2).

Film Forming Conditions:
(Supply of Additive Gas)
Additive gas (NH$_3$) adding process: see Table 2
Flow rate ratio of the additive gas (NH$_3$) to a dilution gas (or to an inert gas in a purging process): see Table 2

(Common Conditions for Each Process)
Chamber pressure: about 800 Pa (about 6 Torr)
Counter purge flow rate (Te): about 500 mL/min (sccm)
Counter purge flow rate (Sb): about 100 mL/min (sccm)
Counter purge flow rate (Ge): about 100 mL/min (sccm)
Backside Ar gas flow rate: about 200 mL/min (sccm)

(viii) A fourth purging process of purging with the inert gas to exhaust a surplus Te source material and a by-product Inert gas (Ar gas) flow rate: about 100 mL/min (sccm)
Inert gas supply time: about 3 seconds
Number of cycle: 16 times to 35 times (see Table 2)

TABLE 2

| | $NH_3$ adding process | Ratio of $NH_3$(sccm)/dilution gas (or inert gas in purging process) (Ar)(sccm) | Composition (atom %) | | | Number of cycles | Film Thickness (nm) | $NH_3$ partial pressure (Torr) |
|---|---|---|---|---|---|---|---|---|
| | | | Ge | Sb | Te | | | |
| Experimental example 11 | (v)~(viii) | 50/100 | 29 | 9 | 62 | 35 | 76 | 0.35 |
| Experimental example 12 | (v)~(viii) | 100/100 | 31 | 5 | 63 | 35 | 106 | 0.67 |
| Experimental example 13 | (v)~(viii) | 100/100 | 29 | 12 | 59 | 16 | 42 | 0.67 |
| Experimental example 14 | (v)~(viii) | 100/200 | 30 | 7 | 62 | 35 | 90 | 0.6 |
| Experimental example 15 | (v)~(viii) | 100/500 | 28 | 11 | 61 | 35 | 61 | 0.46 |
| Experimental example 16 | (v)~(viii) | 50/500 | 25 | 18 | 58 | 35 | 43 | 0.24 |
| Experimental example 17 | ALL | 50/500 | 19 | 22 | 59 | 30 | 54 | 0.24 |
| Experimental example 18 | (v)~(viii) | 100/500 | 29 | 20 | 51 | 20 | 22 | 0.46 |
| Comparative example 2 | — | — | 19 | 39 | 42 | 35 | 21 | 0 |

Flow rate of the dilution gas (or the inert gas in the purging process): see Table 2 (for example, about 100 mL/min (sccm))

(i) A Sb source material introducing process of introducing the Sb source material into the processing vessel Carrier gas flow rate for the Sb source material: about 100 mL/min (sccm)
Sb source material supply time: about 2 seconds (ii) A first purging process of purging with an inert gas to exhaust a surplus Sb source material and a by-product Inert gas (Ar gas) flow rate: about 100 mL/min (sccm)
Inert gas supply time: about 7 seconds (iii) A first Te source material introducing process of introducing the Te source material into the processing vessel Carrier gas flow rate for the Te source material: about 100 mL/min (sccm)
Te source material supply time: about 2 seconds (iv) A second purging process of purging with the inert gas to exhaust a surplus Te source material and a by-product Inert gas (Ar gas) flow rate: about 100 mL/min (sccm)
Inert gas supply time: about 5 seconds (v) A Ge source material introducing process of introducing the Ge source material into the processing vessel Carrier gas flow rate for the Ge source material: about 100 mL/min (sccm)
Ge source material supply time: about 2 seconds (vi) A third purging process of purging with the inert gas to exhaust a surplus Ge source material and a by-product Inert gas (Ar gas) flow rate: about 100 mL/min (sccm)
Inert gas supply time: about 2 seconds (vii) A second Te source material introducing process of introducing the Te source material into the processing vessel Carrier gas flow rate for Te source material: about 100 mL/min (sccm)
Te source material supply time: about 2 seconds In this second example embodiment, by introducing the $NH_3$ gas as the additive gas, it is also possible to control a composition of a Ge—Sb—Te film in a wide range. To be more specific, as compared to a Ge—Sb—Te film obtained by the conventional method, it is possible to form a Ge—Sb—Te film containing rich Ge, less Sb and rich Te.

<Third Example Embodiment>

Now, an example for investigating improvement of smoothness and electrical characteristics of a Ge—Sb—Te film obtained by the film forming method by ALD in accordance with the present example embodiment will be explained.

Figure 2A:
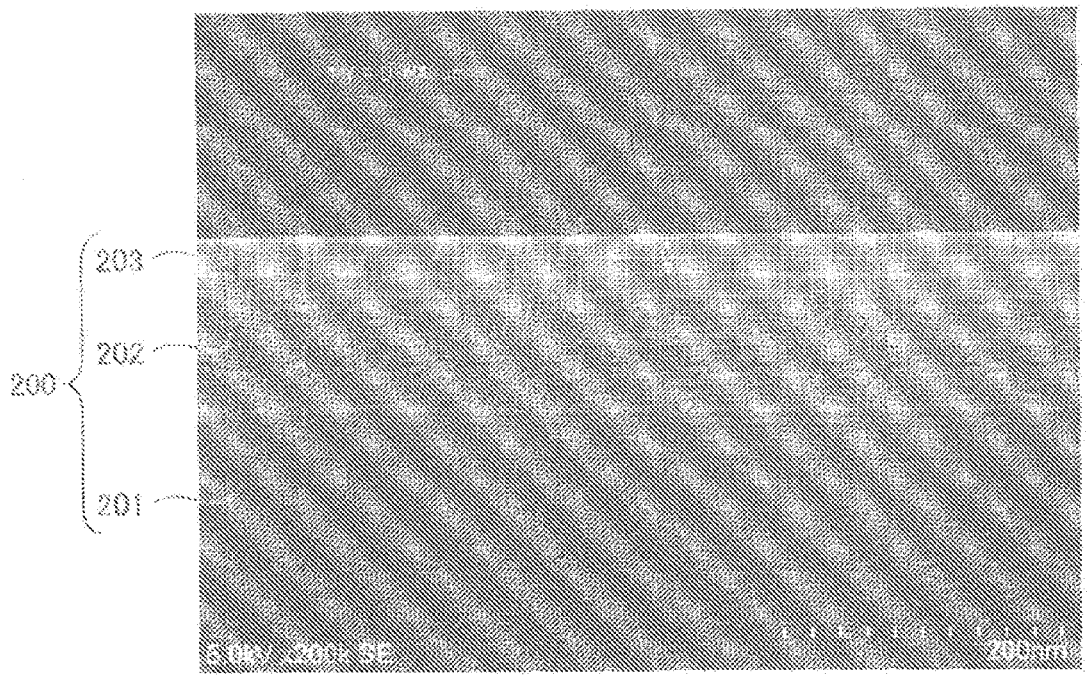
FIG. 2A and FIG. 2B are examples of SEM (Scanning Electron Microscope) images for describing smoothness of a Ge—Sb—Te film in accordance with the example embodiment.
Figure 2B:
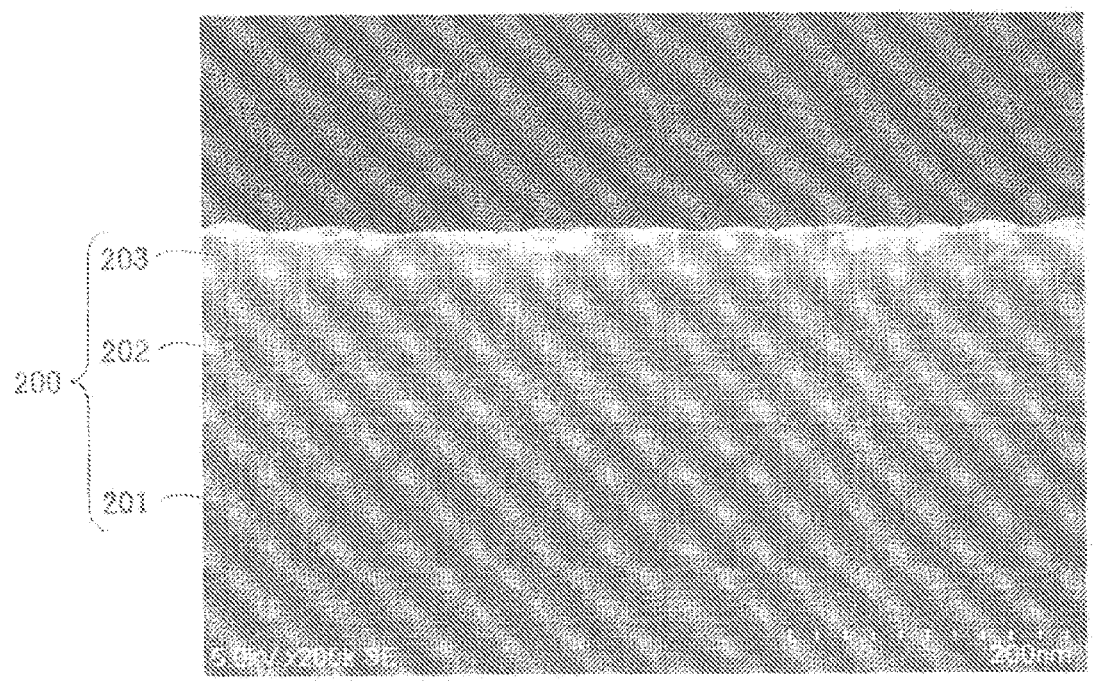

FIG. 2A and FIG. 2B provide scanning electron microscope (SEM) images for describing smoothness of Ge—Sb—Te films obtained in the present example embodiment. In the present example embodiment, a processing target object 200, which is prepared by forming a silicon oxide film 202 on a silicon wafer 201 and forming a Ge—Sb—Te film 203 on the silicon oxide film 202, is used. FIG. 2A is an SEM image of a Ge—Sb—Te film obtained through the same process as that of the experimental example 16 of Table 2, and FIG. 2B is an SEM image of a Ge—Sb—Te film obtained through the same process as that of the comparative example 1 of Table 1.

As can be seen from FIG. 2A and FIG. 2B, as compared to the Ge—Sb—Te film obtained by the method of the comparative example, the Ge—Sb—Te film obtained by the method of the experimental example has high smoothness.

Further, for the Ge—Sb—Te films in FIG. 2A and FIG. 2B, a high resistance duration at a temperature of about 125° C. is measured. As a result, in the case of the Ge—Sb—Te film (experimental example) of FIG. 2A, it is found to maintain a high resistance state for about 350 hours or longer. Meanwhile, in the case of the Ge—Sb—Te film (comparative example) of FIG. 2B, it is found to maintain a high resistance state for just about 50 hours.

Further, nitrogen concentrations in the Ge—Sb—Te films in FIG. 2A and FIG. 2B are measured by secondary ion mass spectrometry (SIMS). As a result, in the Ge—Sb—Te film (experimental example) of FIG. 2A, a nitrogen concentration is found to be about $8.2 \times 10^{18}$ atoms/cc, and in the Ge—Sb—Te film (comparative example) of FIG. 2B, a nitrogen concentration is found to be about $2.7 \times 10^{18}$ atoms/cc. That is, by introducing the NH$_3$ as the additive gas, it is possible to obtain a Ge—Sb—Te film that contains the nitrogen and has high smoothness and high electrical characteristics (high resistance duration at a temperature of about 125° C.).

<Fourth Example Embodiment>

Now, there will be explained an example for investigating controllability of a composition of a Ge—Sb—Te film obtained by a film forming method by CVD in accordance with the present example embodiment and also for investigating improvement of smoothness and electrical characteristics of the Ge—Sb—Te film.

First, a temperature of the sidewall of the processing vessel (chamber) 1 is set to be, e.g., about 50° C. to about 60° C. by the cartridge heaters 46. Further, a temperature of the mounting table is set to be, e.g., about 70° C. by adjusting the lamp power in advance, and the processing target object having a diameter of, e.g., about 300 mm is loaded into the processing vessel by using the arm of the transfer robot. Then, the Ge source material, the Sb source material and the Te source material are supplied under the following conditions (and see Table 3), and a Ge—Sb—Te film is formed by CVD.

Like the film formation by ALD, Ge(OCH$_3$)$_4$ is used as the Ge source material; Sb(OC$_2$H$_3$)$_3$ is used as the Sb source material; and Te(Si(CH$_3$)$_3$)$_2$ is used as the Te source material. Each of these source materials is supplied from the source storage (bottle) heated to a temperature ranging from, e.g., about 30° C. to about 50° C. through the bubbling method by flowing an Ar gas (carrier gas) at a preset flow rate. At this time, the lines from the outlet side of the source storage to the processing vessel are maintained at, e.g., about 50° C. to about 60° C. by the mantle heater.

Further, when performing the film forming method by the CVD, besides the source gases and the carrier Ar gas, a dilution Ar gas for diluting a gas within the chamber and a backside Ar gas for suppress the source gases from being introduced to a rear surface of the substrate are also supplied.

(Film Forming Conditions by CVD)

Chamber pressure: about 800 Pa (about 6 Torr)

Film forming time: about 300 seconds (experimental example 19), about 40 seconds (experimental example 20)

Flow rate ratio of the additive gas (NH$_3$) to a dilution gas (or to an inert gas in a purging process): see Table 3

Carrier gas flow rate for the Ge source material: about 100 mL/min (sccm)

Carrier gas flow rate for the Sb source material: about 100 mL/min (sccm)

Carrier gas flow rate for the Te source material: about 100 mL/min (sccm)

Backside Ar gas flow rate: about 200 mL/min (sccm)

Dilution gas flow rate: about 100 mL/min (sccm)

TABLE 3

| | NH$_3$ adding process | Ratio of NH$_3$(sccm)/dilution gas (or inert gas in purging process) (Ar)(sccm) | Composition (atom %) | | | Film forming time | Film thickness (nm) | NH$_3$ partial pressure (Torr) |
|---|---|---|---|---|---|---|---|---|
| | | | Ge | Sb | Te | | | |
| Experimental example 19 | Performed | 100/100 | 36 | 0 | 64 | 300 | 177 | 1 |
| Experimental example 20 | Not performed | 100/100 | 32 | 15 | 53 | 40 | 17 | 1 |
| Comparative Example 3 | Not performed | — | 19 | 27 | 54 | 300 | 29 | 0 |

Further, a comparative example in which the additive gas (NH$_3$) is not supplied is also shown in Table 3. In this comparative example, a carrier gas flow rate for a Te source material and a dilution gas flow rate are set to be about 50 mL/min (sccm) and about 150 mL/min (sccm), respectively.

Thicknesses and compositions of formed thin films are obtained by X-ray fluorescent analysis (XRF) corrected by Rutherford backscattering spectrometry (RBS).

As can be seen from Table 3, by introducing the NH$_3$ gas as the additive gas, it is possible to control a composition of the Ge—Sb—Te film. To be more specific, as compared to a Ge—Sb—Te film obtained by the conventional method, it is possible to form a Ge—Sb—Te film containing rich Ge, less Sb and rich Te.

When comparing the experimental example 19 and the experimental example 20, the parameter of film forming time is different therebetween, and a film forming time of the experimental example 20 is shorter (see Table 3). At this time, as compared to a Ge—Sb—Te film of the experimental example 19, a Ge—Sb—Te film obtained in the experimental example 20 is found to have a smaller thickness and a higher concentration of Sb in the film. This tendency is also observed in the case of forming a Ge—Sb—Te film by ALD. By way of example, in Table 1, the experimental example 2 and the experimental example 10 are different only in the number of cycles. The number of cycles is smaller in the experimental example 10. In the experimental example 10 having the smaller number of cycles, a Ge—Sb—Te film having a thickness of about 18 nm and a composition of Ge/Sb/Te=about 19/28/53 is obtained. Meanwhile, in the experimental example 2 having the larger number of cycles, a Ge—Sb—Te film having a thickness of about 62 nm and a composition of Ge/Sb/Te=about 30/7/63 is obtained. That is, the Ge—Sb—Te film formed in the experimental example 10 having the smaller number of cycles is found to have a smaller thickness and a higher Sb concentration in the film.

In the film forming method of the present example embodiment, by adjusting a partial pressure of the additive gas (NH$_3$) during the film formation, it is possible to control the composition of the Ge—Sb—Te film. To elaborate, by increasing the partial pressure of the additive gas, the Sb concentration in the Ge—Sb—Te film can be reduced. As stated above, however, since the Sb concentration in the Ge—Sb—Te film tends to increase in a thin film having a thickness equal to or less than about 20 nm, it may be difficult to obtain a film having a low concentration of Sb. Thus, in order to form a Ge—Sb—Te film having a low Sb concentration in the thin film having a thickness equal to or less than about 20 nm, the $NH_3$ partial pressure needs to be further increased. In the ALD method, when comparing the experimental example 10 and the experimental example 9, for example, a Ge—Sb—Te film having a film thickness of about 18 nm and a Sb concentration of about 28% is obtained under a $NH_3$ partial pressure of about 0.67 Torr in the experimental example 10. Meanwhile, a Ge—Sb—Te film having a film thickness of about 15 nm and a Sb concentration of about 20% is obtained under a $NH_3$ partial pressure of about 2.31 Torr in the experimental example 9. That is, by increasing the $NH_3$ partial pressure greatly (e.g., at least three times), the Sb concentration can be decreased by about 8%.

Meanwhile, in the case of the film formation by using the CVD method, it is possible to reduce a Sb concentration at a lower $NH_3$ partial pressure. By way of example, in the experimental example 20 using the CVD method, a Ge—Sb—Te film having a thickness of about 17 nm and a Sb concentration of about 15% is obtained under the $NH_3$ partial pressure of about 1 Torr. Meanwhile, in the experimental example 9 by using the ALD method, a Ge—Sb—Te film having a thickness of about 15 nm and a Sb concentration of about 20% is obtained under the $NH_3$ partial pressure of about 2.31 Torr. That is, when forming the Ge—Sb—Te films having substantially the same thickness, the effect of reducing the Sb concentration obtained by adding the additive gas may be higher when using the CVD method than when using the ALD method.

Figure 3A:
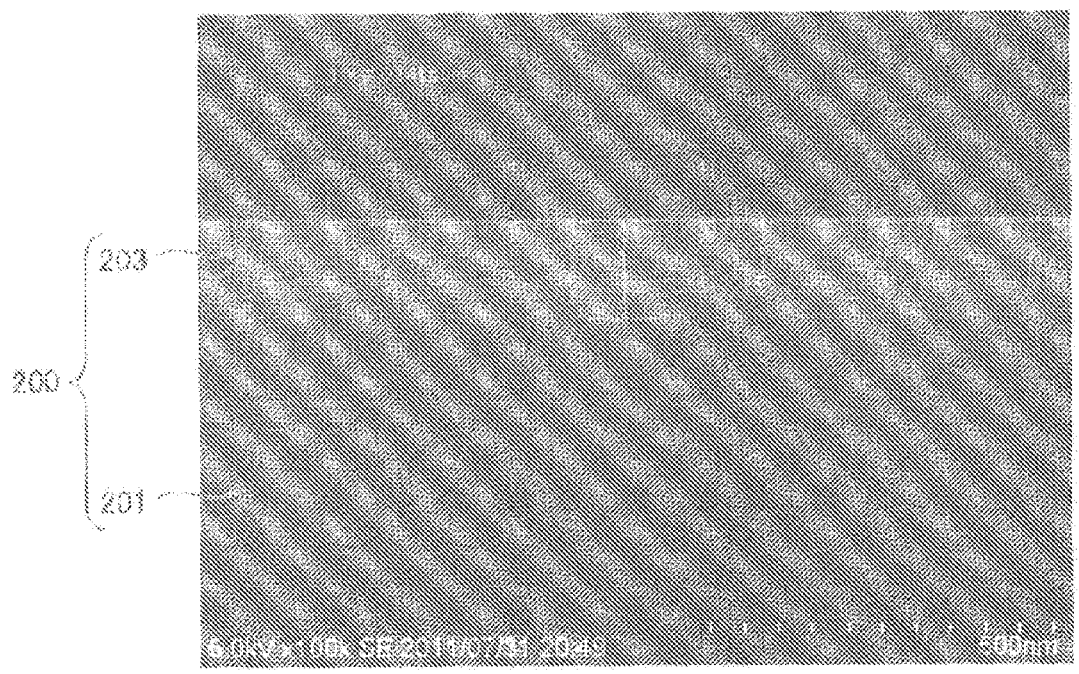
FIG. 3A and FIG. 3B are other examples of SEM images for describing smoothness of a Ge—Sb—Te film in accordance with the example embodiment.
Figure 3B:
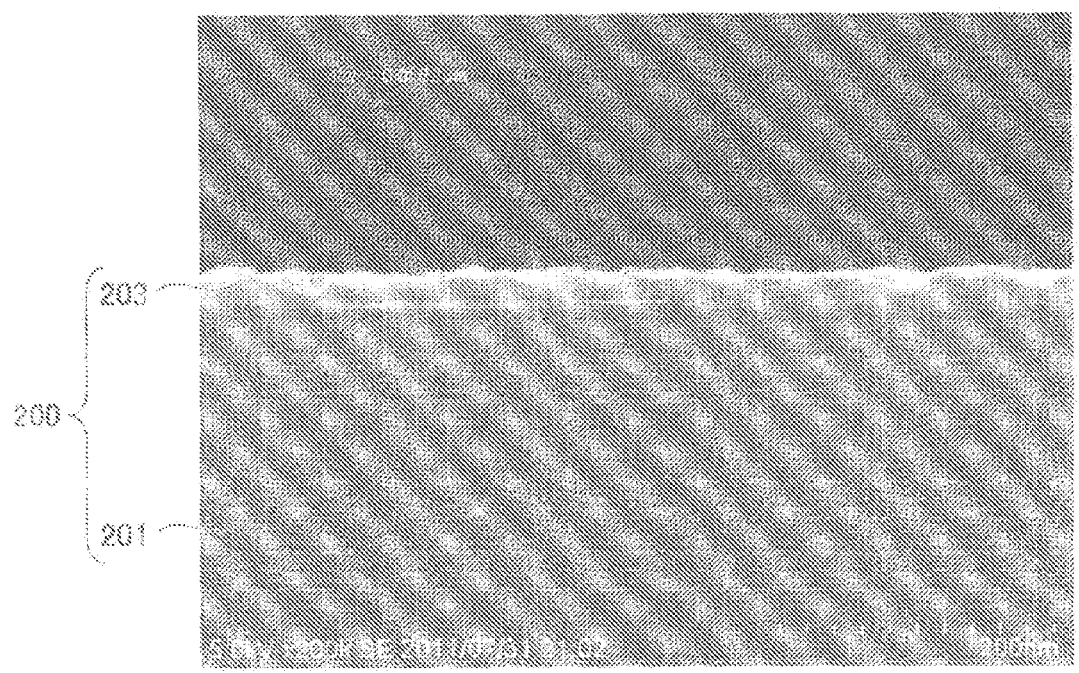

Further, FIG. 3A and FIG. 3B illustrate SEM images for describing smoothness of Ge—Sb—Te films obtained in the present example embodiment. In the present example embodiment, a processing target object 200, which is prepared by forming a Ge—Sb—Te film 203 directly on a silicon wafer 201, is used. FIG. 3A is an SEM image of a Ge—Sb—Te film obtained through a process of the experiment example 19 of Table 3, and FIG. 3B is an SEM image of a Ge—Sb—Te film obtained through a process of the comparative example 3 of Table 3.

As can be seen from FIG. 3A and FIG. 3B, as compared to the Ge—Sb—Te film obtained by the method of the comparative example, the Ge—Sb—Te film obtained by the method of the experimental example has high smoothness.

In the present example embodiment, by introducing the additive gas when forming a Ge—Sb—Te film by ALD or CVD, a composition of the Ge—Sb—Te film can be controlled in a wide range. To elaborate, by introducing the additive gas, it is possible to form a Ge—Sb—Te film having a low Sb concentration. Further, by introducing the additive gas, a film forming rate can be increased. The degree of the increase of the film forming rate is found to be more remarkable as a flow rate ratio of the additive gas to the dilution gas increases or as a partial pressure of the additive gas increases. Meanwhile, it is also found out that, in the same process (i.e., with the same number of cycles), regardless of the addition of the additive gas, the Sb concentration in the Ge—Sb—Te film tends to be increased as the thickness of the Ge—Sb—Te film is thinned. Thus, by increasing the flow rate ratio of the additive gas to the dilution gas or by increasing the partial pressure of the additive gas, it is possible to form a Ge—Sb—Te film having a thin thickness and a low Sb concentration.

In the present example embodiment, as for the composition of the Ge—Sb—Te film, a Ge concentration can be controlled to be in the range from, e.g., about 19 atom % to about 31 atom %; a Sb concentration, in the range from, e.g., about 5 atom % to about 23 atom %; and a Te concentration, in the range from, e.g., about 54 atom % to about 59 atom %. However, the present example embodiment may not be limited to this example, and by varying the flow rate ratio of the additive gas to the dilution gas, the partial pressure of the additive gas, and the number of cycles of the sequence, it is possible to control the composition of the Ge—Te—Sb film in a wider range.

The Ge—Sb—Te film obtained by the method of the present example embodiment is found to have high smoothness and high electrical characteristics (high resistance duration at a temperature of about 125° C.).

<Fifth Example Embodiment>

Now, another example for investigating improvement of smoothness of a Ge—Sb—Te film obtained by a film forming method by ALD in accordance with the present example embodiment will be explained.

Figure 4A:
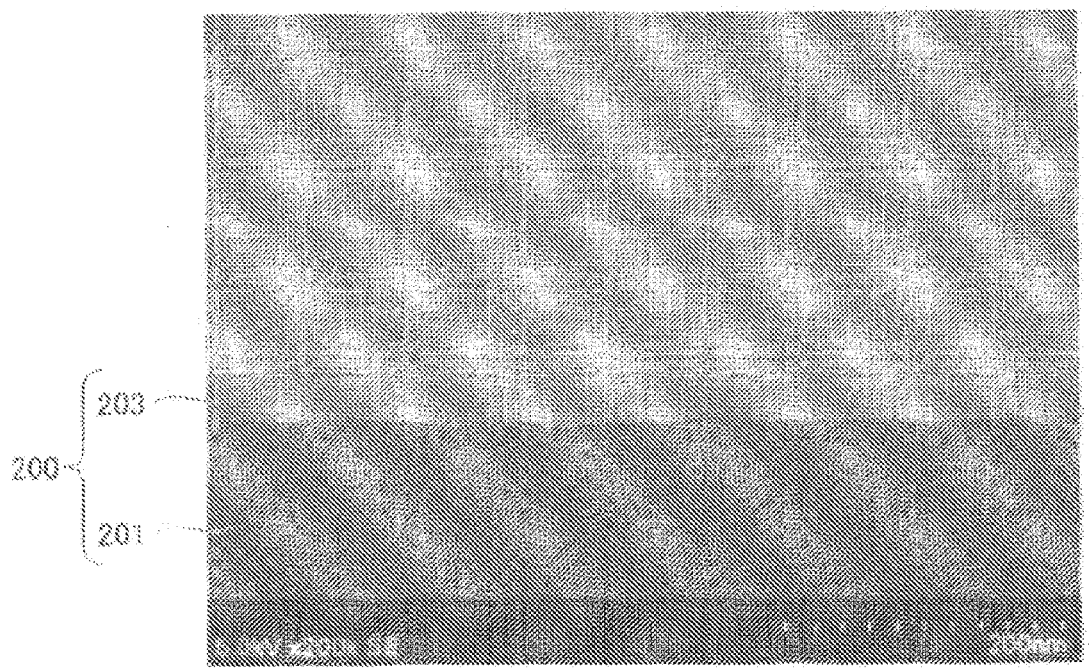
FIG. 4A and FIG. 4B are still other examples of SEM images for describing smoothness of a Ge—Sb—Te film in accordance with the example embodiment.
Figure 4B:
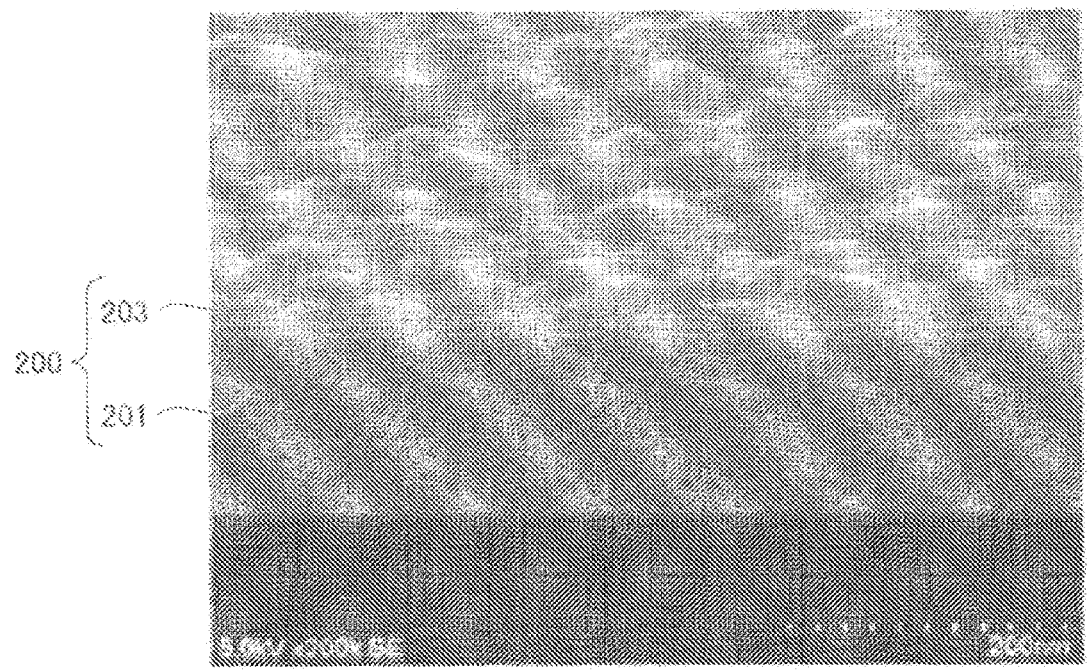

FIG. 4A and FIG. 4B provide other examples of SEM images for describing smoothness of Ge—Sb—Te films obtained in accordance with the present example embodiment. Specifically, FIG. 4A is an SEM image of a Ge—Sb—Te film obtained through the same sequence as that of the second example embodiment under the conditions that a flow rate of a carrier Ar gas for source material is, e.g., about 50 sccm; a ratio of an additive gas flow rate (sccm)/a dilution Ar gas flow rate (sccm) is, e.g., about 25/500 sccm; an additive gas is supplied when introducing a Ge source material, when performing a purging process after introducing the Ge source material, when introducing a Te source material thereafter, and when performing a purging process after introducing the Te source material; and after 30 cycles. FIG. 4B is an SEM image of a Ge—Sb—Te film obtained through the same sequence as that of the first example without supplying the additive gas. The Ge—Sb—Te film of FIG. 4B is obtained after 55 cycles. Further, in the present example embodiment, the SEM images are obtained by using a processing target object 200 prepared by forming a Ge—Sb—Te film 203 on a silicon wafer 201.

As can be seen from the comparison of FIG. 4A and FIG. 4B, the Ge—Sb—Te film obtained by the film forming method of the present example embodiment has high smoothness.

Figure 5:
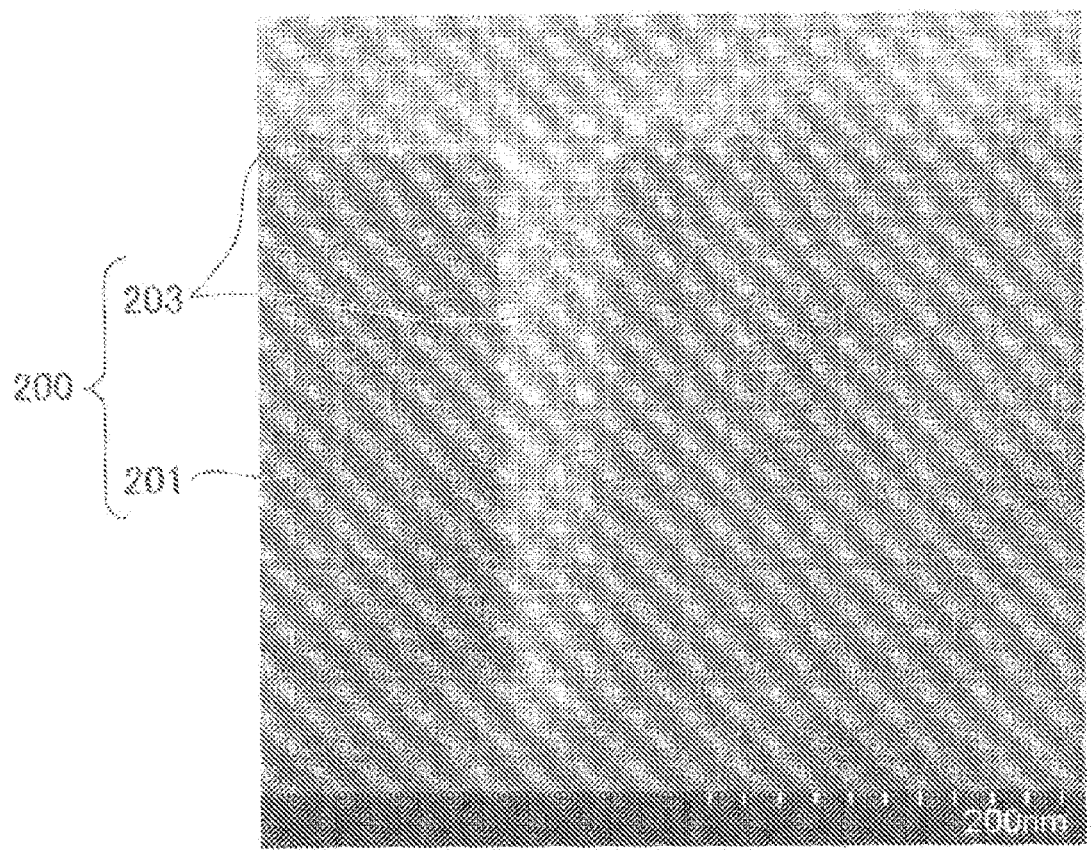
FIG. 5 is still other example of a SEM image for describing smoothness of a Ge—Sb—Te film in accordance with the example embodiment.

FIG. 5 shows still another example SEM image for describing smoothness of a Ge—Sb—Te film in accordance with the present example embodiment. Specifically, FIG. 5 is an SEM image of a Ge—Sb—Te film obtained through the same sequence as that of the second example embodiment under the conditions that a flow rate of a carrier Ar gas for a source material is, e.g., about 50 sccm; a ratio of an additive gas flow rate (sccm)/a dilution Ar gas flow rate (sccm) is, e.g., about 25/500 sccm; an additive gas is supplied when introducing a Ge source material, when performing a purging process after introducing the Ge source material, when introducing a Te source material thereafter, and when performing a purging process after introducing the Te source material; and after 66 cycles. In the present example embodiment, the SEM image is obtained by using a processing target object 200 which is prepared by forming a Ge—Sb—Te film 203 on a silicon wafer 201 in which a hole having a depth of, e.g., about Φ 80 nm×340 nm is formed.

As can be clearly seen from FIG. 5, since a Ge—Sb—Te film formed by the film forming method of the present example embodiment has high smoothness, this film can be effectively buried into the hole.

<Sixth Example Embodiment>

Now, still another example for investigating improvement of smoothness of a Ge—Sb—Te film obtained by a film forming method by ALD in accordance with the present example embodiment will be explained.

Figure 6A:
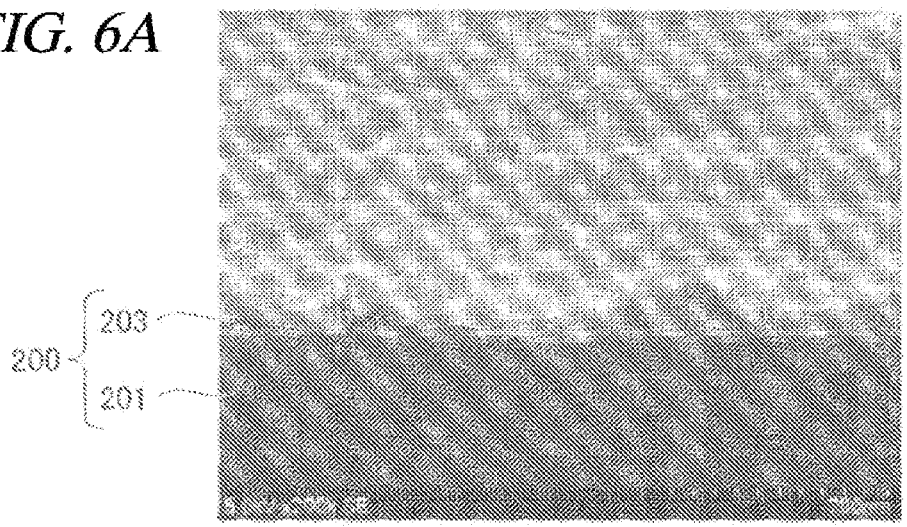
FIG. 6A to FIG. 6C are still other examples of SEM images for describing smoothness of a Ge—Sb—Te film in accordance with the example embodiment.
Figure 6B:
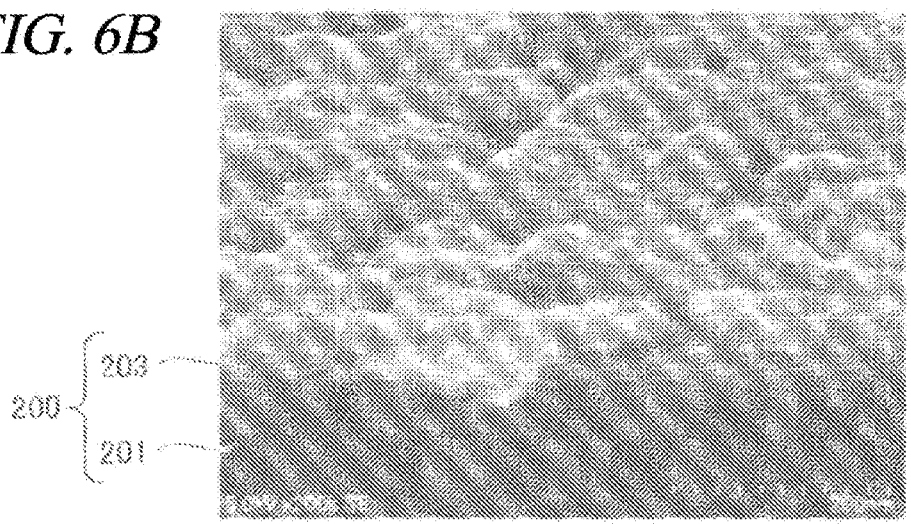
Figure 6C:
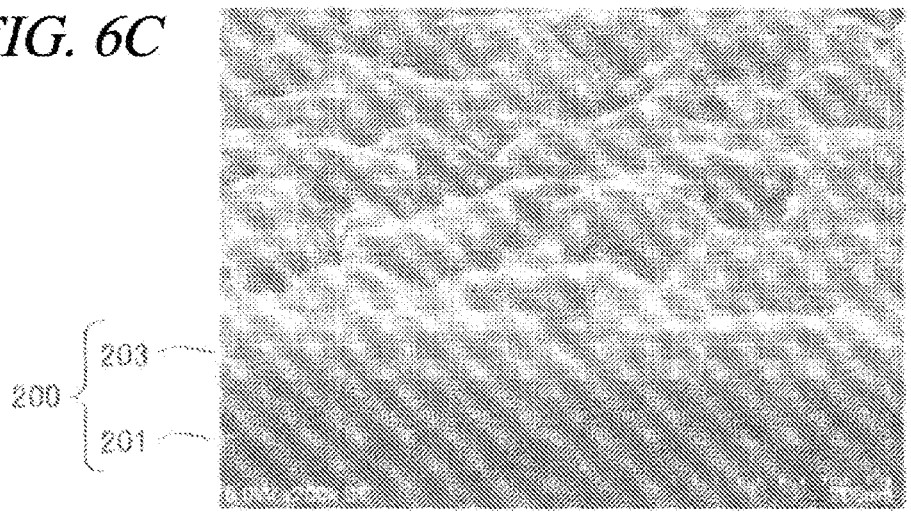

FIG. 6A to FIG. 6C provide still other examples of SEM images for describing smoothness of Ge—Sb—Te films obtained in accordance with the present example embodiment. Specifically, FIG. 6A is an SEM image of a Ge—Sb—Te film obtained through the same sequence as that of the second example embodiment under the conditions that a flow rate of a carrier Ar gas for a source material is, e.g., about 50 sccm; a ratio of an additive gas flow rate (sccm)/a dilution Ar gas flow rate (sccm) is, e.g., about 25/500 sccm; an additive gas is supplied when introducing a Ge source material, when performing a purging process after introducing the Ge source material, when introducing a Te source material thereafter, and when performing a purging process after introducing the Te source material; and after 30 cycles. Further, a heat treatment (annealing process) is performed on the Ge—Sb—Te film of FIG. 6A, which is obtained under the above conditions. FIG. 6B is an SEM image of a Ge—Sb—Te film obtained through the same sequence as that of the second example embodiment under the conditions that a flow rate of a carrier Ar gas for a source material is, e.g., about 50 sccm; a ratio of an additive gas flow rate (sccm)/a dilution Ar gas flow rate (sccm) is, e.g., about 100/100 sccm; an additive gas is supplied when introducing a Ge source material, when performing a purging process after introducing the Ge source material, when introducing a Te source material thereafter, and when performing a purging process after introducing the Te source material; and after 12 cycles. Further, a heat treatment (annealing process) is performed on the Ge—Sb—Te film of FIG. 6B, which is obtained under the above conditions. FIG. 6C is an SEM image of a Ge—Sb—Te film obtained by the same sequence as that of the second example embodiment under the conditions that a flow rate of a carrier Ar gas for a source material is, e.g., about 50 sccm; a ratio of an additive gas flow rate (sccm)/a dilution Ar gas flow rate (sccm) is, e.g., about 100/100 sccm; an additive gas is supplied when introducing a Ge source material, when performing a purging process after introducing the Ge source material, when introducing a Te source material thereafter, and when performing a purging process after introducing the Te source material; and after 8 cycles. Further, a heat treatment (annealing process) is performed on the Ge—Sb—Te film of FIG. 6C, which is obtained under the above conditions. Further, in the present example embodiment, the SEM images are obtained by using a processing target object 200, which is prepared by forming a Ge—Sb—Te film 203 on a silicon wafer 201. Furthermore, the heat treatment is performed under a pressure of about 10 Torr in an Ar atmosphere at a temperature of about 300° C. for about 5 minutes. Moreover, a partial pressure of the additive gas in the example of FIG. 6A is set to be, e.g., about 0.109 Torr (when introducing the Ge source material), about 0.154 Torr (when introducing the Te source material) and about 0.105 Torr (when performing the purging process). Further, the partial pressure of the additive gas in the example of FIG. 6B is set to be, e.g., about 0.571 Torr (when introducing the Ge source material), about 0.923 Torr (when introducing the Te source material) and about 0.545 Torr (when performing the purging process). Furthermore, the partial pressure of the additive gas in the example of FIG. 6C is set to be, e.g., about 2.069 Torr (when introducing the Ge source material), about 2.857 Torr (when introducing the Te source material) and about 2 Torr (when performing the purging process).

In the example of FIG. 6A, the Ge—Sb—Te film is found to be still smooth after performing the annealing process. In the examples of FIG. 6B and FIG. 6C, however, voids are found in the Ge—Sb—Te films after performing the annealing process. That is, in the present example embodiment, it is proved that by setting the partial pressure of the additive gas in the system to be equal to or less than about 0.5 Torr during the film formation, it is possible to form a Ge—Sb—Te film having high smoothness without voids even after performing the annealing process.

Figure 7A:
FIG. 7A and FIG. 7B are still other examples of SEM images for describing smoothness of a Ge—Sb—Te film in accordance with the example embodiment.
Figure 7B:
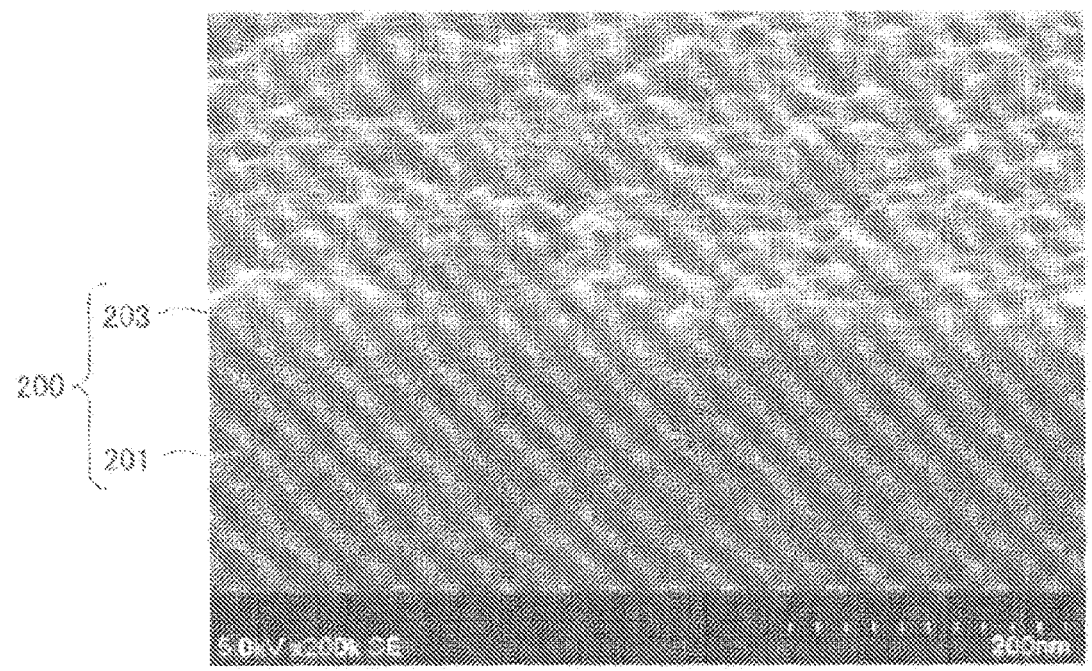

FIG. 7A and FIG. 7B provide still other examples of SEM images for describing smoothness of a Ge—Sb—Te film obtained in accordance with the present example embodiment. Specifically, FIG. 7A is a SEM image of a Ge—Sb—Te film obtained under the conditions that a ratio of an additive gas flow rate (sccm)/a dilution Ar gas flow rate (sccm) is set to, e.g., about 25/500 sccm; and a cycle, in which sequences from (i) to (iv) are repeated 15 times and then sequences from (v) to (viii) are performed one time, is repeated 8 times with a source carrier Ar gas flow rate of, e.g., about 50 sccm in the same film forming conditions as those of the second example embodiment. Further, the heat treatment is performed on the Ge—Sb—Te film of FIG. 7A, which is obtained under the above conditions. FIG. 7B is a SEM image of a Ge—Sb—Te film obtained under the conditions that a cycle, in which the sequences from (i) to (iv) are repeated 15 times and then the sequences from (v) to (viii) is performed one time, is repeated 5 times with a source carrier Ar gas flow rate of, e.g., about 50 sccm and without the additive gas in the same film forming conditions as those of the second example embodiment. Further, the heat treatment is performed on the Ge—Sb—Te film of FIG. 7B, which is obtained under the above conditions. Further, in the example of FIG. 7A, the SEM image is acquired by using a processing target object 200 which is prepared by forming a silicon oxide film 202 on a silicon wafer 201 and then forming a Ge—Sb—Te film 203 on the silicon oxide film 202. In the example of FIG. 7B, the SEM image is acquired by using a processing target object 200 which is prepared by forming a Ge—Sb—Te film 203 on a silicon wafer 201. Furthermore, the heat treatment is performed at a pressure of about 10 Torr in an Ar atmosphere at a temperature of about 300° C. for about 5 minutes. Moreover, a partial pressure of the additive gas in the example of FIG. 7A is set to be, e.g., about 0.109 Torr (when introducing the Ge source material), about 0.109 Torr (when introducing the Sb source material), about 0.154 Torr (when introducing the Te source material) and about 0.105 Torr (when performing the purging process).

In the example of FIG. 7A in which the additive gas is introduced, the Ge—Sb—Te film is found to be still smooth after performing the annealing process. However, in the example of FIG. 7B in which no additive gas is introduced, voids are found in the annealed Ge—Sb—Te film. That is, in the present example embodiment, it is found that by setting the partial pressure of the additive gas in the system to be equal to or less than about 0.5 Torr during the film formation, it is possible to form a Ge—Sb—Te film having high smoothness without voids even after performing the annealing process.

As can be seen from the above, it is desirable to set the partial pressure of the additive gas to be equal to or less than about 0.5 Torr when forming the Ge—Sb—Te film in accordance with the present example embodiment. By setting the partial pressure of the additive gas to be equal to or less than about 0.5 Torr, it is possible to obtain a Ge—Sb—Te film without voids even after performing the annealing process.

<Seventh Example Embodiment>

Now, an example for investigating high orientation of a Ge—Sb—Te film obtained by a film forming method by ALD in accordance with the present example embodiment will be explained.

Figure 8:
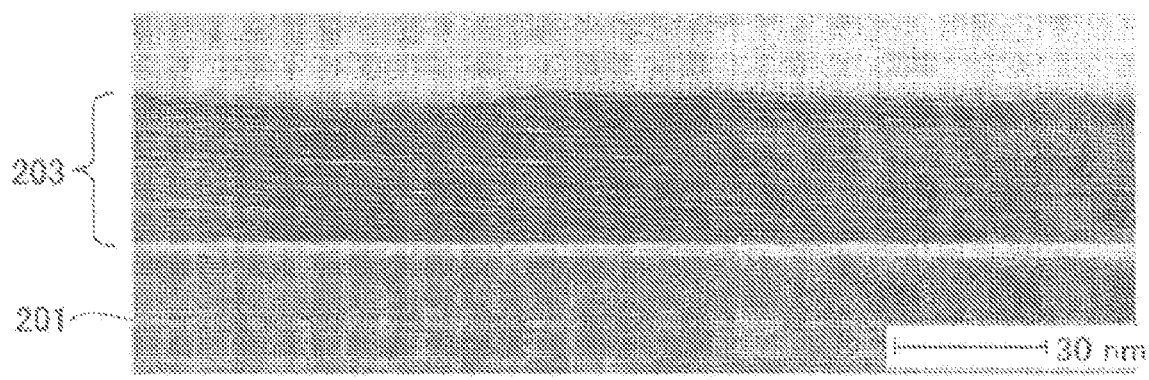
FIG. 8 is an example of a TEM (Transmission Electron Microscope) image for describing an orientation of a Ge—Sb—Te film in accordance with the example embodiment.

FIG. 8 provides a TEM (Transmission Electron Microscope) image for describing orientation of a Ge—Sb—Te film obtained in accordance with the present example embodiment. Specifically, FIG. 8 is a TEM image of a Ge—Sb—Te film obtained under the conditions that a ratio of an additive gas flow rate (sccm)/a dilution Ar gas flow rate (sccm) is set to, e.g., about 25/500 sccm; and a cycle, in which the sequences from (i) to (iv) are repeated 15 times and then the sequences from (v) to (viii) is performed one time, is repeated 4 times with a source carrier Ar gas flow rate of, e.g., about 50 sccm in the same film forming conditions as those of the second example. Further, in the example of FIG. 8, a processing target object 200 which is prepared by forming a Ge—Sb—Te film 203 on a silicon wafer 201 is used, and a TEM image of a cross section thereof is obtained.

In the Ge—Sb—Te film observed in FIG. 8, an interval between horizontal stripes is found to be about 0.5 nm, which is equivalent to a spacing between (006) surfaces of $Sb_2Te$. Further, though not shown, as a result of analyzing the Ge—Sb—Te film obtained in the present example embodiment with an X-ray diffraction apparatus (XRD) by a θ2θ method, peaks derived from Te and $Sb_2Te_3$ are identified.

From the above, it is found that the Ge—Sb—Te film obtained by the film forming method of the present example embodiment has high orientation in which $Sb_2Te_3$ has the c-axis orientation in a normal direction of the substrate.

<Eighth Example Embodiment>

Now, an example for investigating formation of a Sb—Te film by a film forming method by ALD in accordance with the present example embodiment will be explained.

In this example embodiment, a Sb—Te film is formed by using the same apparatus and the same method as those of the first example embodiment except that the sequences from (v) to (viii) in the first example embodiment is not performed and the film forming conditions are changed to as follows.

The film forming conditions and physical properties of the obtained Sb—Te film are shown in Table 4.

(Common Conditions for Each Process)
Chamber pressure: about 800 Pa (about 6 Torr)
Counter purge flow rate (Te): about 500 mL/min (sccm)
Counter purge flow rate (Sb): about 100 mL/min (sccm)
Counter purge flow rate (Ge): about 100 mL/min (sccm)
Backside Ar gas flow rate: about 200 mL/min (sccm)
Flow rate of dilution gas: see Table 4

(I) A Sb source material introducing process of introducing the Sb source material into the processing vessel
Carrier gas flow rate for the Sb source material: about 50 mL/min (sccm)
Sb source material supply time: about 2 seconds (II) A first purging process of purging with an inert gas to exhaust a surplus Sb source material and a by-product
Inert gas (Ar gas) flow rate: see Table 4
Inert gas supply time: about 7 seconds (III) A first Te source material introducing process of introducing the Te source material into the processing vessel
Carrier gas flow rate for Te source material: about 50 mL/min (sccm)
Te source material supply time: about 2 seconds (IV) A second purging process of purging with the inert gas to exhaust a surplus Te source material and a by-product
Inert gas (Ar gas) flow rate: see Table 4
Inert gas supply time: about 5 seconds
Number of cycles: 30 times Further, a comparative example in which an additive gas ($NH_3$) is not supplied is also shown in Table 4.

Figure 9:
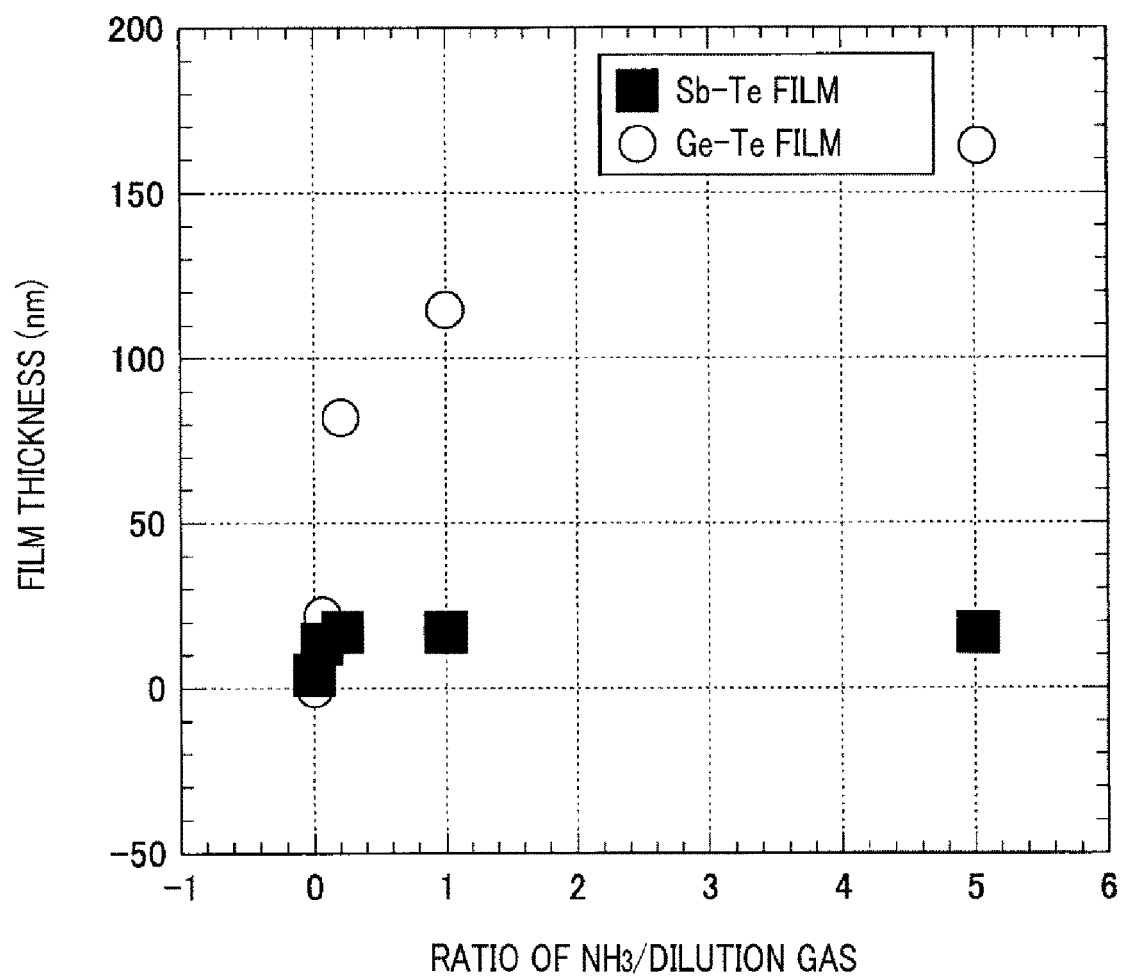
FIG. 9 is a schematic diagram for describing a dependency of thicknesses of a Sb—Te film and a Ge—Te film in accordance with the example embodiment on an ammonia gas concentration.
Figure 10:
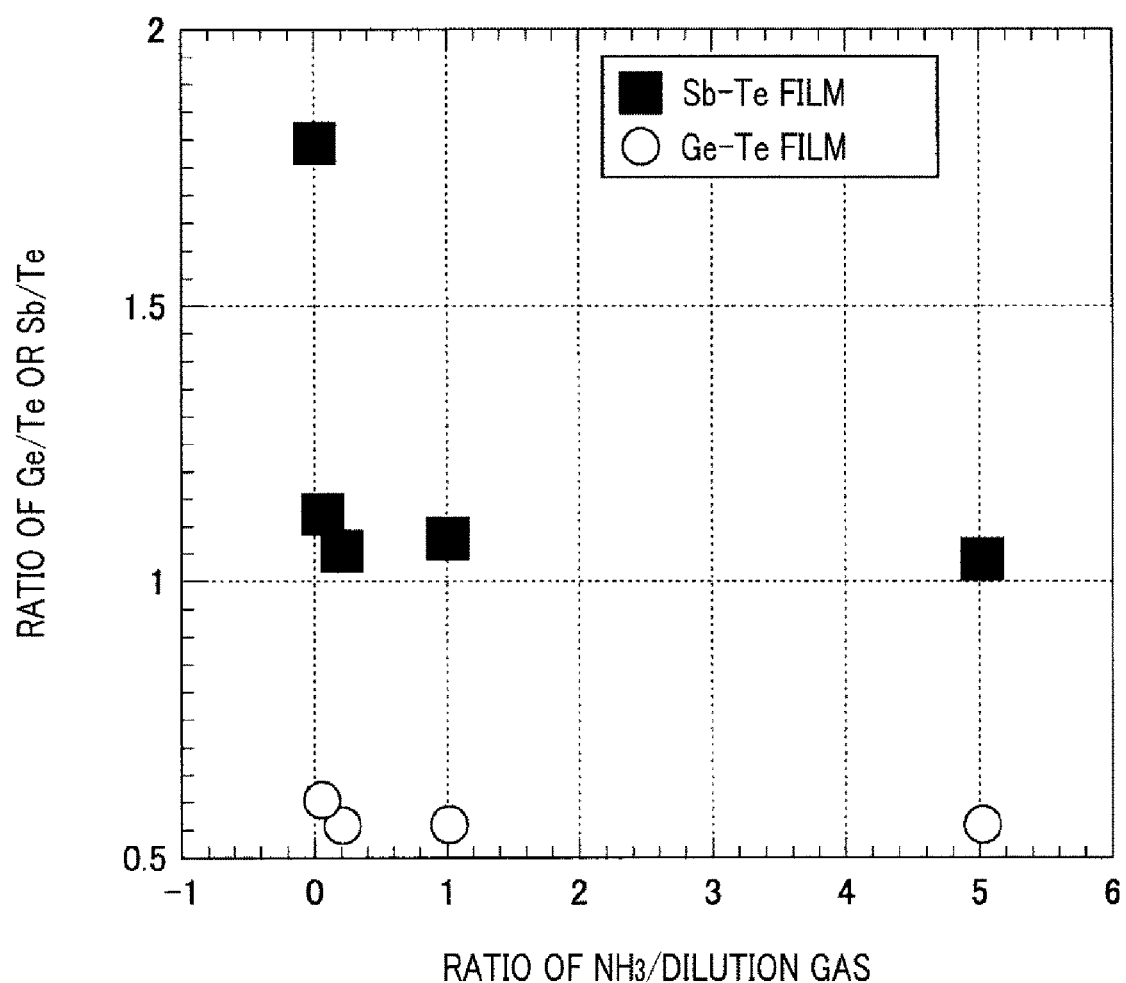
FIG. 10 is a schematic diagram for describing a dependency of compositions of a Sb—Te film and a Ge—Te film concentration in accordance with the example embodiment on an ammonia gas.

FIG. 9 is a schematic diagram for describing a dependency of thicknesses of a Sb—Te film in accordance with the present example embodiment and a Ge—Te film in accordance with a following example embodiment to be described later on an ammonia gas concentration. FIG. 10 is a schematic diagram for describing a dependency of compositions of the Sb—Te film in accordance with the present example embodiment and the Ge—Te film in accordance with the following example embodiment to be described later on an ammonia gas concentration.

As can be seen from Table 4, FIG. 9 and FIG. 10, as compared to the case without introducing the additive gas, a film forming amount per a cycle can be increased by introducing the additive gas. Further, within a range where a ratio of a flow rate of the additive gas to a flow rate of a dilution Ar

TABLE 4

|  | Ratio of $NH_3$(sccm)/dilution gas (or inert gas in purging process) | Composition (atom %) | | | Film Thickness | $NH_3$ partial pressure | Ratio of |
| --- | --- | --- | --- | --- | --- | --- | --- |
|  | (Ar)(sccm) | Ge | Sb | Te | (nm) | (Torr) | Te/Sb |
| Experimental example 25 | 25/500 | 0 | 53 | 47 | 13.9 | — | 0.89 |
| Experimental example 26 | 100/500 | 0 | 51 | 48 | 17.3 | — | 0.94 |
| Experimental example 27 | 100/100 | 0 | 52 | 48 | 17.2 | — | 0.92 |
| Experimental example 28 | 500/100 | 0 | 51 | 49 | 17.2 | — | 0.96 |
| Comparative example 4 | 0/100 | 0 | 64 | 36 | 3.9 | — | 0.56 |

Film Forming Conditions:
(Supply of Additive Gas)
Flow rate ratio of an additive gas ($NH_3$) to a dilution gas (or an inert gas): see Table 4 gas is equal to or less than about 0.2 (a partial pressure of the additive gas ranges from about 0.4 Torr to about 0.6 Torr), it is possible to increase the film forming amount per a cycle by introducing the additive gas. However, the effect of increasing the film forming amount is no more improved in a range where the ratio of the flow rate of the additive gas to the dilution Ar gas exceeds about 0.2.

Further, a ratio of Te/Sb in the Sb—Te film obtained without introducing the additive gas is about 0.56, whereas a ratio of Te/Sb in case of introducing the additive gas is in the range from about 0.89 to about 0.96. That is, by introducing the additive gas, it is possible to form a Sb—Te film having a high Te concentration.

<Ninth Example Embodiment>

Now, an example for investigating formation of a Ge—Te film by a film forming method by ALD in accordance with the present example embodiment will be explained.

In this example, a Ge—Te film is formed by using the same apparatus and the same method as those of the first example embodiment except that the sequences from (v) to (viii) in the first example embodiment is not performed and the film forming conditions are changed to as follows.

The film forming conditions and physical properties of the obtained Ge—Te film are shown in Table 5.

TABLE 5

| | Ratio of NH$_3$(sccm)/dilution gas (or inert gas in purging process) (Ar)(sccm) | Composition (atom %) | | | Number of Cycle | Film Thickness (nm) | NH$_3$ partial pressure (Torr) | Ratio of Te/Ge |
|---|---|---|---|---|---|---|---|---|
| | | Ge | Sb | Te | | | | |
| Experimental example 21 | 25/500 | 38 | 0 | 62 | 30 | 22.7 | — | 1.64 |
| Experimental example 22 | 100/500 | 36 | 0 | 64 | 30 | 82.8 | — | 1.80 |
| Experimental example 23 | 100/100 | 36 | 0 | 64 | 30 | 115.6 | — | 1.78 |
| Experimental example 24 | 500/100 | 36 | 0 | 64 | 30 | 164.8 | — | 1.78 |
| Comparative example 5 | 0/100 | — | | | 30 | 0 | — | — |

Film Forming Conditions:
(Supply of Additive Gas)
Flow rate ratio of an additive gas (NH$_3$) to a dilution gas (or to an inert gas): see Table 5
(Common Conditions for Each Process)
Chamber pressure: about 800 Pa (about 6 Torr)
Counter purge flow rate (Te): about 500 mL/min (sccm)
Counter purge flow rate (Sb): about 100 mL/min (sccm)
Counter purge flow rate (Ge): about 100 mL/min (sccm)
Backside Ar gas flow rate: about 200 mL/min (sccm)
Flow rate of dilution gas: see Table 5
(1) A Ge source material introducing process of introducing the Ge source material into the processing vessel
  Carrier gas flow rate for the Ge source material: about 50 mL/min (sccm)
  Ge source material supply time: about 2 seconds
(2) A first purging process of purging with an inert gas to exhaust a surplus Ge source material and a by-product
  Inert gas (Ar gas) flow rate: see Table 5
  Inert gas supply time: about 2 seconds
(3) A first Te source material introducing process of introducing the Te source material into the processing vessel
  Carrier gas flow rate for Te source material: about 50 mL/min (sccm)
  Te source material supply time: about 2 seconds
(4) A second purging process of purging with the inert gas to exhaust a surplus Te source material and a by-product
  Inert gas (Ar gas) flow rate: see Table 5
  Inert gas supply time: about 3 seconds
  Number of cycles: 30 times Further, a comparative example in which the additive gas (NH$_3$) is not supplied is also shown in Table 5.

As can be seen from Table 5, FIG. 9 and FIG. 10, when the additive gas is not introduced, a Ge—Te film cannot be formed. However, by introducing the additive gas, it is possible to form a Ge—Te film. Further, within the range of the present example embodiment, as the ratio of the flow rate of the additive gas to the flow rate of the dilution Ar gas increases, a film forming amount per a cycle also increases. Further, in the range of the present example embodiment, a ratio of Te/Ge in case of introducing the additive gas is in the range from about 1.64 to about 1.8. The ratio of Te/Ge does not depend on the ratio of the flow rate of the additive gas to the flow rate of the dilution Ar gas.

The present international application claims the benefit of Japanese Patent Application Ser. No. 2011-179981, filed on Aug. 19, 2011, of which specification, claims and drawings are hereby incorporated by reference in its entirety.

We claim:

1. A Ge—Sb—Te film forming method comprising:
a Sb source material introducing process of introducing a Sb source material represented by (R$_2$O)$_3$Sb;
a first purging process of purging with an inert gas after the Sb source material introducing process;
a Te source material introducing process of introducing a Te source material represented by (R$_3$R$_4$R$_5$Si)$_2$Te or (R$_3$R$_4$R$_5$Si)$_2$TeR$_6$;
a second purging process of purging with the inert gas after the Te source material introducing process;
a Ge source material introducing process of introducing a Ge source material represented by (R$_1$O)$_4$Ge or (R$_1$O)$_n$GeH$_{4-n}$; and
a third purging process of purging with the inert gas after the Ge source material introducing process,
wherein the R$_2$ denotes an aromatic group or an alkyl group that has a straight chain structure, a branched chain structure, or a cyclic structure, and has a carbon number ranging from 1 to 10,
each of R$_3$, R$_4$, R$_5$ and R$_6$ denotes a hydrogen, an aromatic group or an alkyl group that has a straight chain structure, a branched chain structure or a cyclic structure, and has a carbon number ranging from 1 to 10, and has a double bond,
the R$_1$ denotes an aromatic group or an alkyl group that has a straight chain structure, a branched chain structure, or a cyclic structure, and has a carbon number ranging from 1 to 10, and n denotes a natural number ranging from 1 to 3, an additive gas containing at least one of ammonia, methylamine, dimethylamine, hydrazine, monomethylhydrazine, dimethylhydrazine and pyridine is introduced in at least one of the Sb, Te and Ge source material introducing processes and the first to third purging processes, and a Sb concentration in the Ge—Sb—Te film is controlled by adjusting a partial pressure of the additive gas.

2. The Ge—Sb—Te film forming method of claim 1, further comprising:
   a second Te source material introducing process of introducing the Te source material after the third purging process; and
   a fourth purging process of purging with the inert gas after the second Te source material introducing process,
   wherein the Te source material introducing process is a first Te source material introducing process.

3. The Ge—Sb—Te film forming method of claim 2,
   wherein the Sb source material introducing process, the first purging process, the first Te source material introducing process, the second purging process, the Ge source material introducing process, the third purging process, the second Te source material introducing process and the fourth purging process are repeated a preset number of times.

4. The Ge—Sb—Te film forming method of claim 2, further comprising:
   a repeating process of repeating the Sb source material introducing process, the first purging process, the first Te source material introducing process and the second purging process a preset number of times; and
   a repeating process of repeating the Ge source material introducing process, the third purging process, the second Te source material introducing process and the fourth purging process a preset number of times.

5. The Ge—Sb—Te film forming method of claim 1,
   wherein the additive gas is ammonia.

6. The Ge—Sb—Te film forming method of claim 1,
   wherein the Ge—Sb—Te film is $Ge_2Sb_2Te_5$.

7. The Ge—Sb—Te film forming method of claim 1,
   wherein the additive gas is introduced such that the partial pressure of the additive gas is in a range equal to or less than about 0.5 Torr.

8. A Ge—Sb—Te film forming method comprising:
   introducing a Ge source material represented by $(R_1O)_4Ge$ or $(R_1O)_nGeH_{4-n}$, a Sb source material represented by $(R_2O)_3Sb$, a Te source material represented by $(R_3R_4R_5Si)_2Te$ or $(R_3R_4R_5Si)_2TeR_6$, and an additive gas containing one of ammonia ($NH_3$), methylamine, dimethylamine, hydrazine, monomethylhydrazine, dimethylhydrazine and pyridine,
   wherein the $R_1$ denotes an aromatic group or an alkyl group that has a straight chain structure, a branched chain structure, or a cyclic structure, has a carbon number ranging from 1 to 10, and n denotes a natural number ranging from 1 to 3,
   the $R_2$ denotes an aromatic group or an alkyl group that has a straight chain structure, a branched chain structure, or a cyclic structure, and has a carbon number ranging from 1 to 10,
   each of $R_3$, $R_4$, $R_5$ and $R_6$ denotes a hydrogen, an aromatic group or an alkyl group that has a straight chain structure, a branched chain structure or a cyclic structure, and has a carbon number ranging from 1 to 10, and has a double bond, and
   a Sb concentration in the Ge—Sb—Te film is controlled by adjusting a partial pressure of the additive gas.

9. The Ge—Sb—Te film forming method of claim 8,
   wherein the additive gas is ammonia.

10. The Ge—Sb—Te film forming method of claim 8,
    wherein the Ge—Sb—Te film is $Ge_2Sb_2Te_5$.

11. A Sb—Te film forming method comprising:
    a Sb source material introducing process of introducing a Sb source material represented by $(R_2O)_3Sb$;
    a first purging process of purging with an inert gas after the Sb source material introducing process;
    a Te source material introducing process of introducing a Te source material represented by $(R_3R_4R_5Si)_2Te$ or $(R_3R_4R_5Si)_2TeR_6$; and
    a second purging process of purging with the inert gas after the Te source material introducing process,
    wherein the $R_2$ denotes an aromatic group or an alkyl group having a straight chain structure, a branched chain structure, or a cyclic structure having a carbon number ranging from 1 to 10,
    each of $R_3$, $R_4$, $R_5$ and $R_6$ denotes an aromatic group or an alkyl group having a straight chain structure, a branched chain structure or an annular double bond structure having a hydrogen number and a carbon number ranging from 1 to 10,
    an additive gas containing at least one of ammonia, methylamine, dimethylamine, hydrazine, monomethylhydrazine, dimethylhydrazine and pyridine is introduced in at least one of the Sb and Te source material introducing processes and the first and second purging processes, and
    a Sb concentration in the Sb—Te film is controlled by adjusting a partial pressure of the additive gas.

12. The Sb—Te film forming method of claim 11,
    wherein the additive gas is ammonia.

13. A Sb—Te film forming method comprising:
    introducing a Sb source material represented by $(R_2O)_3Sb$, a Te source material represented by $(R_3R_4R_5Si)_2Te$ or $(R_3R_4R_5Si)_2TeR_6$, and an additive gas containing one of ammonia, methylamine, dimethylamine, hydrazine, monomethylhydrazine, dimethylhydrazine and pyridine,
    wherein the $R_2$ denotes an aromatic group or an alkyl group that has a straight chain structure, a branched chain structure, or a cyclic structure, and has a carbon number ranging from 1 to 10,
    each of $R_3$, $R_4$, $R_5$ and $R_6$ denotes a hydrogen, an aromatic group or an alkyl group that has a straight chain structure, a branched chain structure or a cyclic structure, and has a carbon number ranging from 1 to 10, and has a double bond, and
    a Sb concentration in the Sb—Te film is controlled by adjusting a partial pressure of the additive gas.

14. The Sb—Te film forming method of claim 13,
    wherein the additive gas is ammonia.

15. A Ge—Sb—Te film forming method comprising:
    a Sb source material introducing process of introducing a Sb source material represented by $(R_2O)_3Sb$;
    a Te source material introducing process of introducing a Te source material represented by $(R_3R_4R_5Si)2Te$ or $(R_3R_4R_5Si)_2TeR_6$; and
    a Ge source material introducing process of introducing a Ge source material represented by $(R_1O)_4Ge$ or $(R_1O)_nGeH_{4-n}$,
    wherein the $R_2$ denotes an aromatic group or an alkyl group that has a straight chain structure, a branched chain structure, or a cyclic structure, and has a carbon number ranging from 1 to 10, each of $R_3$, $R_4$, $R_5$ and $R_6$ denotes a hydrogen, an aromatic group or an alkyl group that has a straight chain structure, a branched chain structure or a cyclic structure, and has a carbon number ranging from 1 to 10, and has a double bond, the R1 denotes an aromatic group or an alkyl group that has a straight chain structure, a branched chain structure, or a cyclic structure, and has a carbon number ranging from 1 to 10, and n denotes a natural number ranging from 1 to 3, an additive gas containing at least one of ammonia, methylamine, dimethylamine, hydrazine, monomethylhydrazine, dimethylhydrazine and pyridine is introduced in at least one of the Sb, Te and Ge source material introducing processes, and a Sb concentration in the Ge—Sb—Te film is controlled by adjusting a partial pressure of the additive gas.

16. The Ge—Sb—Te film forming method of claim 15, wherein the additive gas is ammonia.

17. The Ge—Sb—Te film forming method of claim 15, wherein the Ge—Sb—Te film is $Ge_2Sb_2Te_5$.

18. The Ge—Sb—Te film forming method of claim 15, wherein the additive gas is introduced such that the partial pressure of the additive gas is in a range equal to or less than about 0.5 Torr.

* * * * *

UNITED STATES PATENT AND TRADEMARK OFFICE
CERTIFICATE OF CORRECTION

| | | |
|---|---|---|
| PATENT NO. | : 9,246,098 B2 | Page 1 of 1 |
| APPLICATION NO. | : 14/182586 | |
| DATED | : January 26, 2016 | |
| INVENTOR(S) | : Kawano et al. | |

It is certified that error appears in the above-identified patent and that said Letters Patent is hereby corrected as shown below:

In the specification, column 23, line 29, please replace "θ2θ" with -- θ-2θ --.

Signed and Sealed this
Tenth Day of May, 2016

Michelle K. Lee
*Director of the United States Patent and Trademark Office*